(12) United States Patent
Nakao

(10) Patent No.: US 6,828,080 B2
(45) Date of Patent: *Dec. 7, 2004

(54) PATTERN FORMING METHOD AND METHOD OF FABRICATING DEVICE

(75) Inventor: Shuji Nakao, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 164 days.

This patent is subject to a terminal disclaimer.

(21) Appl. No.: 10/127,772

(22) Filed: Apr. 23, 2002

(65) Prior Publication Data

US 2003/0091940 A1 May 15, 2003

(30) Foreign Application Priority Data

Nov. 9, 2001 (JP) .................................... 2001-344414

(51) Int. Cl.⁷ .............................. G03F 7/00; G03F 7/20
(52) U.S. Cl. ...................... 430/311; 430/5; 430/312; 430/313; 430/322; 430/324; 430/394; 430/396
(58) Field of Search .................... 430/5, 311, 312, 430/313, 322, 394, 396

(56) References Cited

U.S. PATENT DOCUMENTS

| | | | | |
|---|---|---|---|---|
| 5,403,685 A | * | 4/1995 | Vidusek et al. ................ | 430/18 |
| 6,314,022 B1 | * | 11/2001 | Kawata et al. ......... | 365/185.05 |
| 6,338,926 B1 | * | 1/2002 | Ku et al. ...................... | 430/30 |
| 6,340,603 B1 | * | 1/2002 | Bell ............................. | 438/9 |
| 6,458,312 B1 | * | 10/2002 | Sumi et al. .................. | 264/512 |
| 6,489,085 B2 | * | 12/2002 | Huang et al. ................ | 430/322 |
| 6,548,312 B1 | * | 4/2003 | Hayano et al. ................ | 438/5 |
| 6,605,411 B2 | * | 8/2003 | Nakao .......................... | 430/311 |
| 6,706,453 B2 | * | 3/2004 | Nakao ............................. | 430/5 |
| 6,709,792 B2 | * | 3/2004 | Nakao ............................. | 430/5 |
| 2002/0150844 A1 | * | 10/2002 | Nakao ........................ | 430/394 |
| 2002/0155395 A1 | * | 10/2002 | Nakao ........................ | 430/394 |

FOREIGN PATENT DOCUMENTS

| | | |
|---|---|---|
| JP | 5-303191 | 11/1993 |
| JP | 2000-66372 | 3/2000 |

OTHER PUBLICATIONS

S. Nakao, et al "*Extension of Krf Lithography To Sub–50 nm Pattern Formation,*" Proceedings of SPIE vol. 4000, pp. 1 8. Copyright 2000.

* cited by examiner

Primary Examiner—Mark F. Huff
Assistant Examiner—Nicole Barreca
(74) Attorney, Agent, or Firm—McDermott Will & Emery LLP

(57) ABSTRACT

The inventive pattern forming method for transferring a bright line pattern to a photoresist material with a photomask having the bright line pattern includes a step of transferring the bright line pattern of the photomask to the photoresist material by exposure with a light exposure of at least four times and not more than 10 times the light exposure photosensitizing the photoresist material and inverting solubility. Thus, excellent CD-focus characteristics are attained thereby obtaining a pattern forming method and a method of fabricating a device with small dimensional dispersion.

15 Claims, 30 Drawing Sheets

FIG.13

| Bright Line Width (μm) \ Dark Line Width (μm) | 0.1 | 0.12 | 0.14 | 0.16 | 0.18 | 0.2 | 0.24 | 0.28 | 0.32 | 0.36 | 0.4 | 0.5 | 0.6 | 0.7 | 0.8 | 0.9 | 1 | 1.2 | 1.6 | 2 |
|---|---|---|---|---|---|---|---|---|---|---|---|---|---|---|---|---|---|---|---|---|
| 0.1 | 0.103 | 0.106 | 0.105 | 0.101 | 0.094 | 0.079 | 0.000 | 0.000 | 0.000 | 0.000 | 0.000 | 0.000 | 0.000 | 0.000 | 0.000 | 0.000 | 0.000 | 0.000 | 0.000 | 0.000 |
| 0.12 | 0.167 | 0.152 | 0.150 | 0.150 | 0.149 | 0.147 | 0.132 | 0.119 | 0.125 | 0.123 | 0.110 | 0.090 | 0.087 | 0.088 | 0.094 | 0.095 | 0.095 | 0.095 | 0.095 | 0.094 |
| 0.14 | 0.196 | 0.183 | 0.181 | 0.182 | 0.184 | 0.185 | 0.185 | 0.180 | 0.179 | 0.179 | 0.178 | 0.175 | 0.174 | 0.171 | 0.170 | 0.168 | 0.168 | 0.167 | 0.166 | 0.165 |
| 0.16 | 0.226 | 0.208 | 0.205 | 0.208 | 0.211 | 0.215 | 0.217 | 0.212 | 0.212 | 0.212 | 0.214 | 0.211 | 0.211 | 0.206 | 0.204 | 0.202 | 0.202 | 0.201 | 0.199 | 0.199 |
| 0.18 | 0.253 | 0.231 | 0.228 | 0.230 | 0.234 | 0.238 | 0.241 | 0.238 | 0.236 | 0.237 | 0.239 | 0.236 | 0.234 | 0.230 | 0.228 | 0.227 | 0.226 | 0.226 | 0.224 | 0.224 |
| 0.2 | 0.279 | 0.255 | 0.250 | 0.252 | 0.257 | 0.261 | 0.264 | 0.262 | 0.259 | 0.260 | 0.262 | 0.258 | 0.255 | 0.250 | 0.249 | 0.247 | 0.247 | 0.246 | 0.244 | 0.245 |
| 0.24 | 0.000 | 0.302 | 0.294 | 0.298 | 0.303 | 0.309 | 0.311 | 0.308 | 0.303 | 0.304 | 0.306 | 0.300 | 0.297 | 0.291 | 0.290 | 0.289 | 0.288 | 0.287 | 0.285 | 0.286 |
| 0.28 | 0.000 | 0.350 | 0.343 | 0.346 | 0.350 | 0.354 | 0.359 | 0.356 | 0.351 | 0.352 | 0.353 | 0.346 | 0.342 | 0.336 | 0.336 | 0.334 | 0.332 | 0.332 | 0.330 | 0.330 |
| 0.32 | 0.000 | 0.392 | 0.386 | 0.389 | 0.393 | 0.398 | 0.406 | 0.401 | 0.396 | 0.396 | 0.399 | 0.390 | 0.385 | 0.380 | 0.379 | 0.377 | 0.376 | 0.377 | 0.373 | 0.374 |
| 0.36 | 0.000 | 0.433 | 0.428 | 0.430 | 0.434 | 0.440 | 0.447 | 0.441 | 0.437 | 0.437 | 0.439 | 0.427 | 0.423 | 0.418 | 0.417 | 0.415 | 0.415 | 0.415 | 0.411 | 0.412 |
| 0.4 | 0.000 | 0.475 | 0.468 | 0.469 | 0.474 | 0.480 | 0.486 | 0.481 | 0.476 | 0.476 | 0.473 | 0.460 | 0.457 | 0.451 | 0.450 | 0.450 | 0.450 | 0.447 | 0.446 | 0.446 |
| 0.5 | 0.000 | 0.582 | 0.571 | 0.573 | 0.578 | 0.584 | 0.590 | 0.584 | 0.575 | 0.572 | 0.564 | 0.555 | 0.550 | 0.546 | 0.547 | 0.546 | 0.544 | 0.541 | 0.542 | 0.542 |
| 0.6 | 0.000 | 0.677 | 0.670 | 0.672 | 0.676 | 0.681 | 0.683 | 0.674 | 0.666 | 0.664 | 0.660 | 0.645 | 0.641 | 0.640 | 0.639 | 0.637 | 0.635 | 0.634 | 0.634 | 0.635 |
| 0.7 | 0.000 | 0.780 | 0.769 | 0.770 | 0.775 | 0.779 | 0.780 | 0.771 | 0.761 | 0.759 | 0.753 | 0.742 | 0.741 | 0.737 | 0.734 | 0.731 | 0.730 | 0.731 | 0.730 | 0.733 |
| 0.8 | 0.000 | 0.873 | 0.866 | 0.867 | 0.871 | 0.875 | 0.876 | 0.867 | 0.859 | 0.857 | 0.849 | 0.839 | 0.836 | 0.830 | 0.828 | 0.827 | 0.827 | 0.827 | 0.827 | 0.829 |
| 0.9 | 0.000 | 0.974 | 0.964 | 0.966 | 0.971 | 0.975 | 0.976 | 0.965 | 0.956 | 0.954 | 0.951 | 0.939 | 0.932 | 0.926 | 0.925 | 0.925 | 0.926 | 0.925 | 0.927 | 0.928 |
| 1 | 0.000 | 1.071 | 1.064 | 1.066 | 1.070 | 1.074 | 1.074 | 1.064 | 1.055 | 1.052 | 1.049 | 1.034 | 1.028 | 1.025 | 1.025 | 1.025 | 1.025 | 1.025 | 1.027 | 1.027 |
| 1.2 | 0.000 | 1.271 | 1.264 | 1.265 | 1.269 | 1.273 | 1.273 | 1.263 | 1.255 | 1.252 | 1.243 | 1.230 | 1.227 | 1.224 | 1.224 | 1.224 | 1.224 | 1.225 | 1.227 | 1.227 |
| 1.6 | 0.000 | 1.670 | 1.663 | 1.665 | 1.668 | 1.671 | 1.671 | 1.659 | 1.650 | 1.647 | 1.642 | 1.630 | 1.626 | 1.622 | 1.624 | 1.624 | 1.625 | 1.626 | 1.628 | 1.627 |
| 2 | 0.000 | 2.070 | 2.063 | 2.064 | 2.068 | 2.071 | 2.071 | 2.060 | 2.051 | 2.048 | 2.041 | 2.030 | 2.028 | 2.026 | 2.026 | 2.026 | 2.027 | 2.027 | 2.028 | 2.029 |

FIG.20B
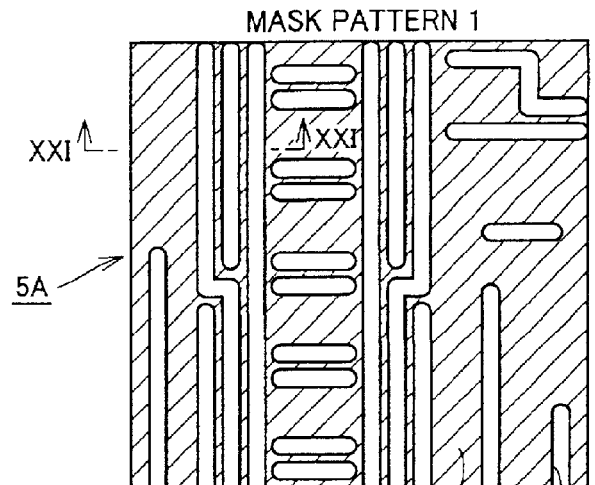
FIG.20A
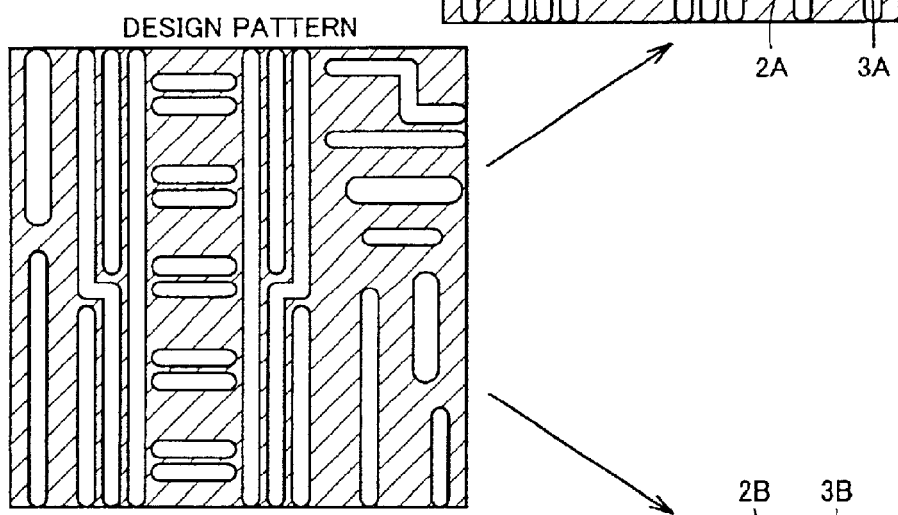
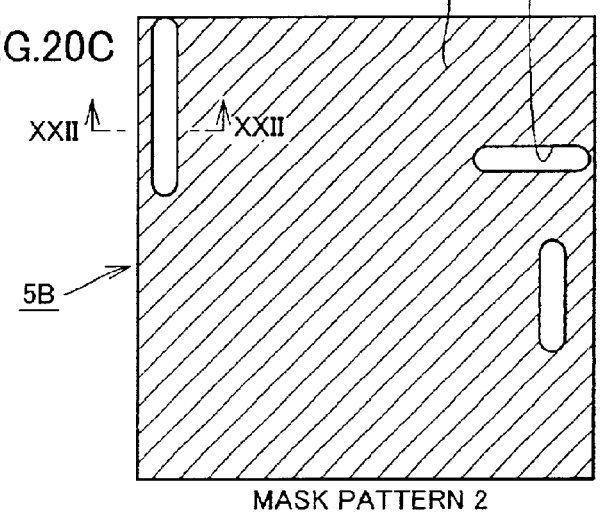
FIG.20C

PATTERN FORMING METHOD AND METHOD OF FABRICATING DEVICE

BACKGROUND OF THE INVENTION

1. Field of the Invention

The present invention relates to a pattern forming method and a method of fabricating a device, and more particularly, it relates to a pattern forming method of transferring a bright line pattern to a photosensitive material through a photomask having the bright line pattern and a method of fabricating a device.

2. Description of the Prior Art

In recent years, a semiconductor integrated circuit is remarkably highly integrated and refined. Following such integration and refinement of the semiconductor integrated circuit, refinement of a circuit pattern formed on a semiconductor substrate hereinafter simply referred to as a wafer) is also rapidly progressed.

In particular, photolithography is widely recognized as a basic technique in pattern formation. Therefore, various developments and improvements have been made in relation to the photolithography. However, refinement of patterns is increasingly progressed, along with stronger requirement for improvement of pattern resolution.

The photolithography is a technique of transferring a pattern formed on a photomask (subject copy) to a photoresist material applied onto a wafer and patterning a lower etched film with the photoresist material having the transferred pattern.

In this transfer step, the photoresist material is developed. In this development, part irradiated with light is removed in a positive photoresist material, while part not irradiated with light is removed in a negative photoresist material.

In general, the resolution limit R (nm) in photolithography employing reduction exposure is expressed as follows:

$$R = k_1 \cdot \lambda / (NA)$$

where $\lambda$ represents the wavelength (nm) of employed light, NA represents the numerical aperture of a projection optical system of a lens, and $k_1$ represents a constant depending on imaging conditions and a resist process.

As understood from the above equation, the constant $k_1$ and the wavelength $\lambda$ may be reduced while increasing the numerical aperture NA, in order to improve the resolution limit R, i.e., in order to obtain a fine pattern. In other words, the constant $k_1$ depending on the resist process may be reduced while the wavelength $\lambda$ may be reduced and the numerical aperture NA may be increased.

In this case, it is technically difficult to reduce the wavelength of a light source, and the numerical aperture NA must be increased at the same wavelength. If the numerical aperture NA is increased, however, the depth $\delta$ of focus ($\delta = k_2 \cdot \lambda / (NA)^2$) is reduced to disadvantageously deteriorate the shape and the dimensional accuracy of the formed pattern.

In general, a fine pattern formed on a fine bright line mask employed as a photomask is transferred to a photoresist material by performing exposure with a light exposure of 2.5 to three times the light exposure (Eth) inverting solubility of the photoresist material. The exposure is performed with such a light exposure for substantially equalizing the pattern dimension in the photomask and the finished dimension of the pattern transferred onto the photoresist material to each other and simplifying the pattern design.

In order to transfer the pattern of the photomask to the photoresist material by exposure with high resolution in such photolithography, the photoresist material must be conformed with the best focal plane of the projection optical system within the range of the depth of focus.

When exposure is performed under the aforementioned condition, however, the CD (critical dimension) is so remarkably fluctuated by focal change that excellent CD-focus characteristics cannot be obtained. In other words, the dimension of the pattern formed on the photoresist material is remarkably fluctuated following focal change. In transfer onto a finite step on an actual substrate, therefore, the focus changes by about this step and hence the critical dimension is disadvantageously remarkably dispersed in correspondence thereto.

SUMMARY OF THE INVENTION

An object of the present invention is to provide a pattern forming method and a method of fabricating a device increasing a depth of focus by attaining excellent CD-focus characteristics thereby reducing dispersion of a critical dimension.

The pattern forming method according to the present invention, employing a photomask having a bright line pattern for transferring the bright line pattern to a photosensitive material, comprises a step of transferring the bright line pattern of the photomask to the photosensitive material by exposure with a light exposure of at least four times and not more than 10 times the light exposure (Eth) for photosensitizing the photosensitive material and inverting solubility.

The inventor has made deep study in order to solve the aforementioned problem, to find that light intensity keeping the pattern dimension of a photoresist material substantially unchanged following focal change is present within a light exposure range of at least four times and not more than 10 times the light exposure (Eth) for photosensitizing the photoresist material and inverting solubility.

According to the inventive pattern forming method, exposure is performed with light intensity based on this recognition, whereby iso-focal characteristics are obtained for keeping the pattern dimension of the photoresist material substantially unchanged following focal change, so that remarkably excellent CD-focal characteristics can be obtained and the depth of focus (DOF) can be increased.

When exposure is performed with the light exposure of at least four times and not more than 10 times the light exposure (Eth), the finished pattern dimension of the photoresist material differs from the pattern dimension on the photomask. Also in this case, however, design of a device pattern is not complicated due to the recent development of the CAD (computer-aided design) technique.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a Table showing results of calculation of dimensional change of bright line images having various bright line widths and dark line widths;

FIGS. 20A to 20C are diagrams for illustrating a method of extracting patterns from design patterns according to a third embodiment of the present invention;

DESCRIPTION OF THE PREFERRED EMBODIMENTS

Embodiments of the present invention are now described with reference to the drawings.

(First Embodiment)

Figure 1:
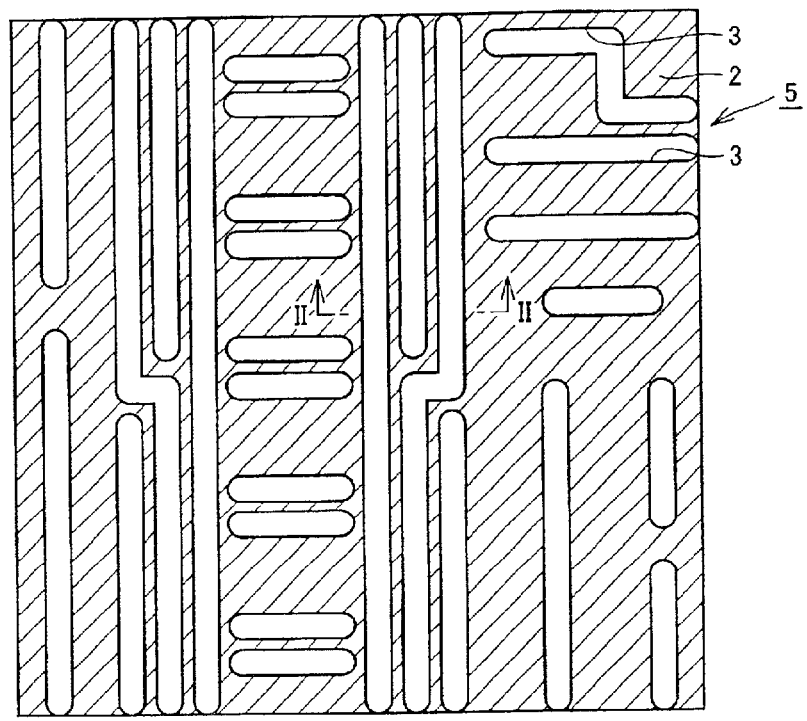
FIG. 1 illustrates the structure of a photomask pattern employed for a pattern forming method according to a first embodiment of the present invention.
Figure 2:
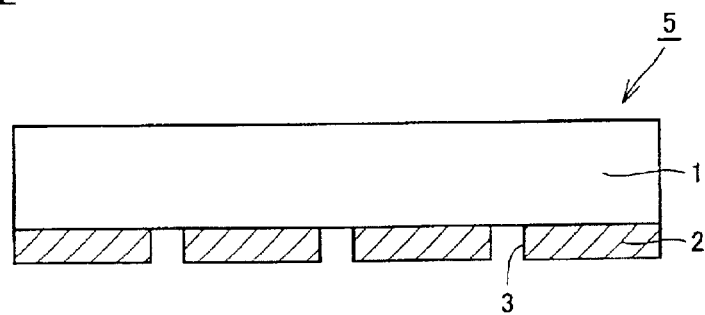
FIG. 2 is a schematic sectional view taken along the line II—II in FIG. 1.

Referring to FIGS. 1 and 2, a photomask 5 employed in a pattern forming method according to a first embodiment of the present invention has a substrate 1 transmitting exposure light and a screen film 2 formed on the surface of the substrate 1. Linear opening patterns 3 are formed on the screen film 2 as bright line patterns.

Figure 3:
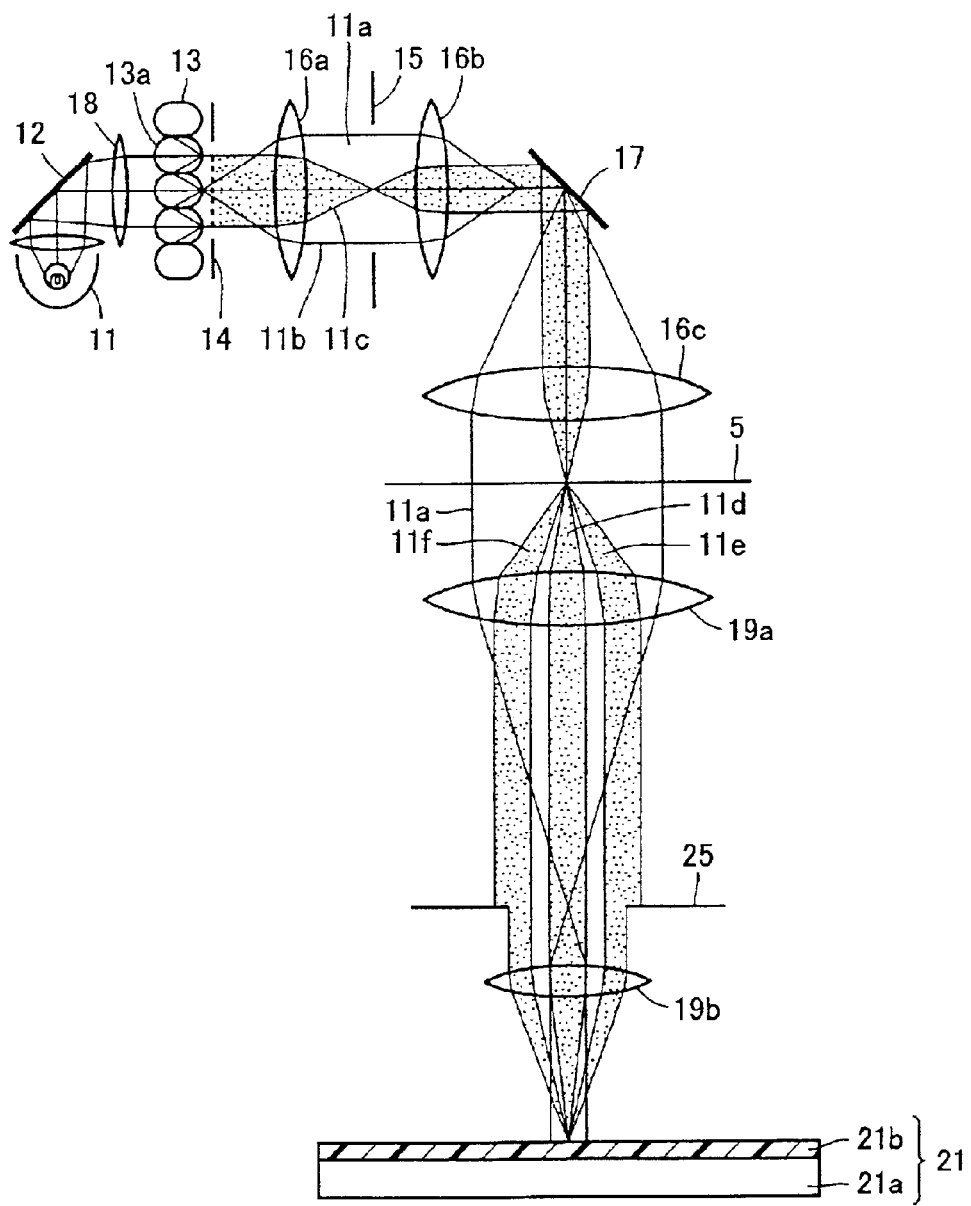
FIG. 3 schematically illustrates the structure of an exposure apparatus employed for the pattern forming method according to the first embodiment of the present invention.

The bright line patterns 3 formed on the photomask 5 are transferred by exposure to a photoresist material 21b, which is a photosensitive material, through an exposure apparatus shown in FIG. 3. The pattern forming method according to this embodiment is characterized in that the bright line patterns 3 of the photomask 5 are transferred to the photoresist material 21b by exposure with a light exposure of at least four times and not more than 10 times the light exposure (Eth) photosensitizing the photoresist material 21b and inverting solubility. The aforementioned light exposure attains light intensity keeping the pattern dimension of the photoresist material 21b substantially unchanged following focal change.

The structure of the exposure apparatus and the pattern forming method are now described in detail.

Referring to FIG. 3, the exposure apparatus, which is a reduction projection exposure apparatus (stepper), reduces the patterns formed on the photomask 5 and projects the reduced patterns onto the photoresist material 21b provided on the surface of a wafer 21. This exposure apparatus has an illumination optical system from a light source 11 to the patterns of the photomask 5 and a projection optical system from the patterns of the photomask 5 to the wafer 21.

The illumination optical system has the light source 11 formed by a mercury lamp, a reflector 12, a condensing lens 18, a fly-eye lens 13, a diaphragm 14, condensing lenses 16a, 16b and 16c, a blind diaphragm 15 and a reflector 17. The projection optical system has projection lenses 19a and 19b and an iris diaphragm 25.

In exposure, the reflector 12 reflects only G-line radiation (wavelength: 436 nm), for example, so that light 11a emitted from the mercury lamp 11 is converted to monochromatic light. Then, the light 11a passes through the condensing lens 18 to be incident upon each fly-eye forming lens 13a of the fly-eye lens 13, and thereafter passes through the diaphragm 14.

Each fly-eye forming lens 13a forms an optical path 11b, and the fly-eye lens 13 forms an optical path 11c.

The light 11a passing through the diaphragm 14 further passes through the condensing lens 16a, the blind diaphragm 15 and the condensing lens 16b, to be reflected by the reflector 17 at a prescribed angle.

The light 11a reflected by the reflector 17 is transmitted through the condensing lens 16c and thereafter applied to the overall surface of the photomask 5 formed with the prescribed patterns. Thereafter the light 11a is reduced to a prescribed magnification by the projection lenses 19a and 19b, to expose the photoresist material 21b provided on a semiconductor substrate 21a.

The pattern forming method according to this embodiment is now described.

Figure 4:
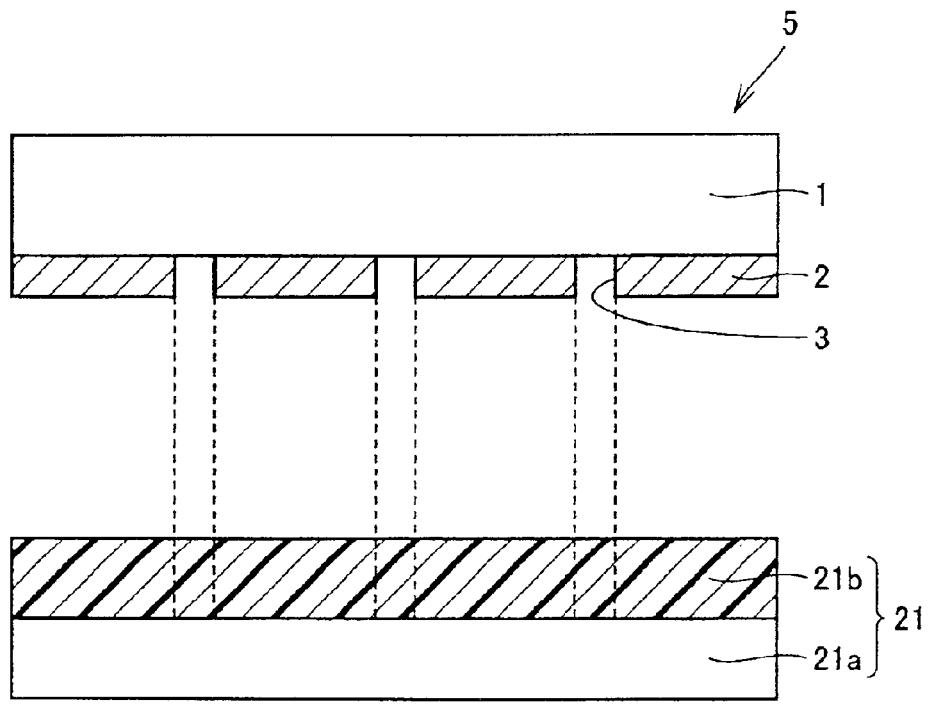
FIGS. 4 and 5 are schematic sectional views successively showing steps of the pattern forming method according to the first embodiment of the present invention.

Referring to FIG. 4, the exposure apparatus shown in FIG. 3 transfers the fine bright line patterns 3 of the photomask 5 shown in FIGS. 1 and 2 to the photoresist material 21b provided on the semiconductor substrate 21a by exposure. At this time, the exposure apparatus transfers the bright line patterns 3 of the photomask 5 to the photoresist material 21b with a light exposure of at least four times and not more than 10 times the light exposure (Eth) photosensitizing the photoresist material 21b and inverting solubility. This light exposure attains light intensity keeping the pattern dimension of the photoresist material 21b substantially unchanged following focal change. For example, the exposure apparatus performs exposure with a light exposure (Eth)/0.14.

Thereafter the photoresist material 21b is developed.

Figure 5:
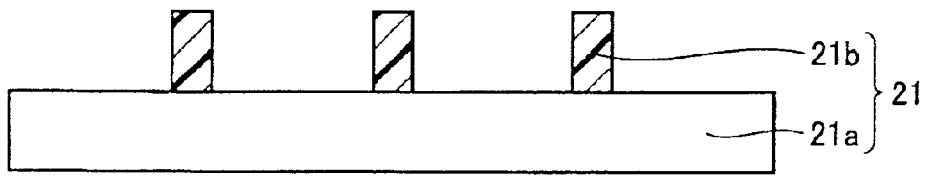

When the photoresist material 21b is of a negative type, only exposed regions of the bright line patterns 3 are left for defining linear residual patterns 21b due to the aforementioned development, as shown in FIG. 5. The patterns 3 of the photomask 5 shown in FIG. 1 are transferred as the linear residual patterns 21b having planar shapes shown in FIG. 6. In this state, the line width L of the residual patterns 21b is 0.23 µm, for example.

Figure 6:
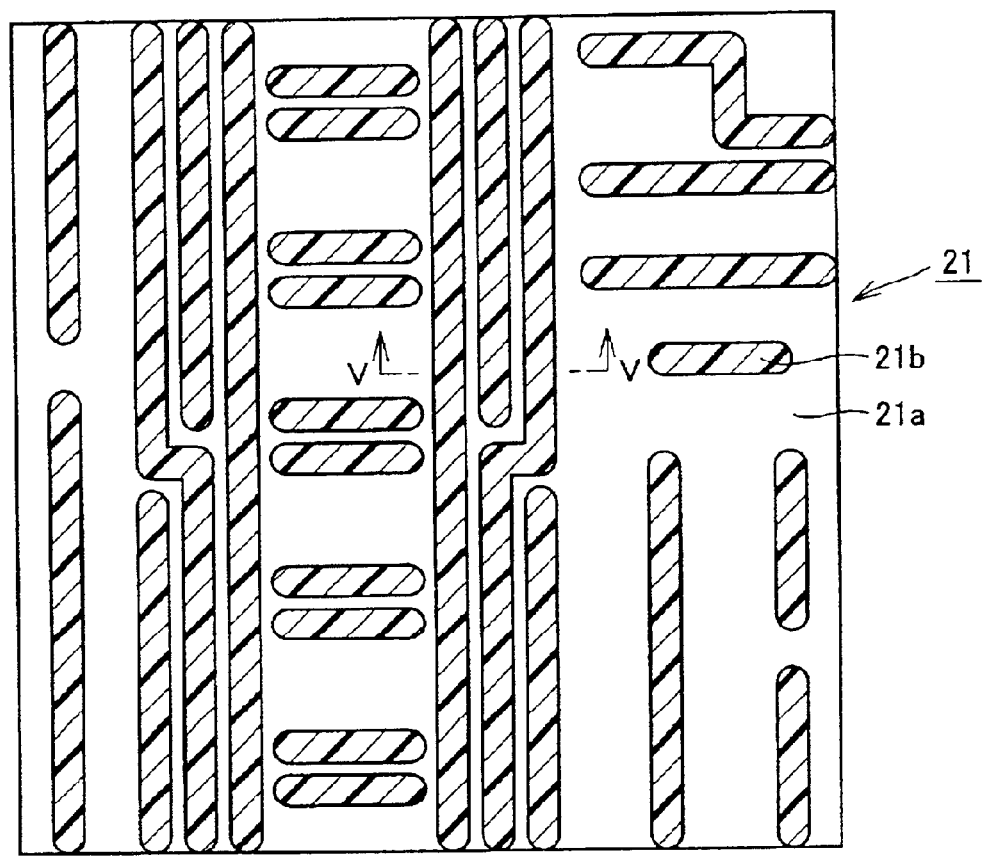
FIG. 6 is a schematic plan view showing a resist pattern formed through the mask pattern shown in FIG. 1.

FIG. 5 corresponds to a sectional view taken along the line V—V in FIG. 6.

Figure 7:
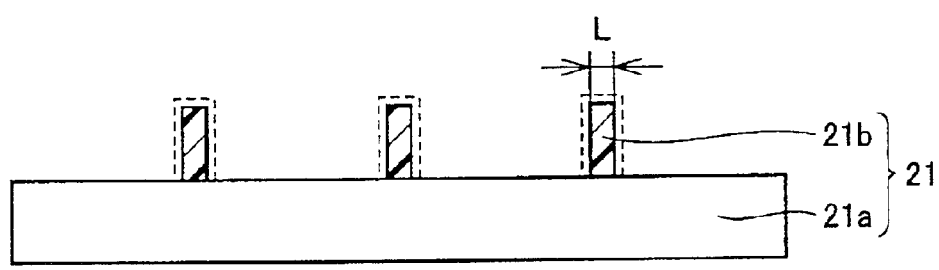
FIG. 7 is a schematic sectional view for illustrating partial ashing.

Thereafter the photoresist material 21b is exposed to an atmosphere containing active oxygen and subjected to partial ashing, so that the photoresist material 21b is isotropically removed and reduced in section as shown in FIG. 7. Thus, the line width L of the residual line patterns 21b can be reduced. The line width L of the residual line patterns 21b is reduced to 0.10 µm, for example, after the partial ashing.

The photomask 5 shown in FIGS. 1 and 2 may be either a binary mask or a halftone phase-shift mask. When the photomask 5 is a binary mask, the screen film 2 consists of chromium (Cr), for example, having exposure light transmittance which can be regarded as substantially zero.

Figure 8A:
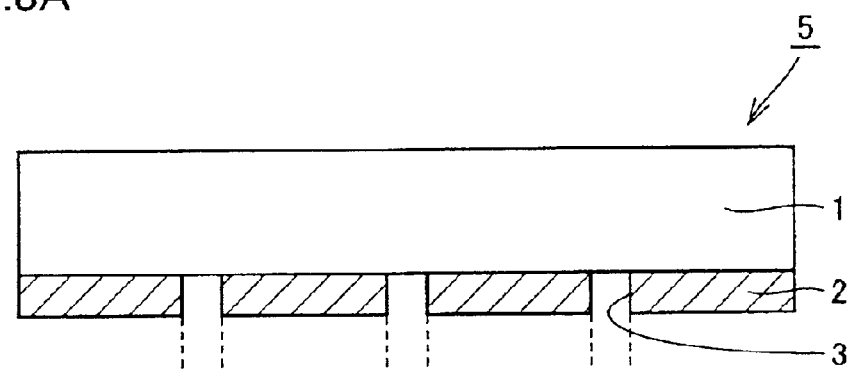
FIGS. 8A and 8B are diagrams for illustrating a halftone phase-shift mask.

When the photomask 5 is a halftone phase-shift mask, the screen film 2 is formed by a half-screen film having a phase shifter function as shown in FIG. 8A. In other words, the screen film 2 has the function of a phase shifter rendering the exposure light transmitted through the screen film 2 substantially 180° out of phase with the exposure light transmitted through the bright line patterns 3 while attenuating the exposure light so that the intensity of the exposure light transmitted through the screen film 2 is smaller than that of the exposure light transmitted through the bright line patterns 3.

Figure 8B:
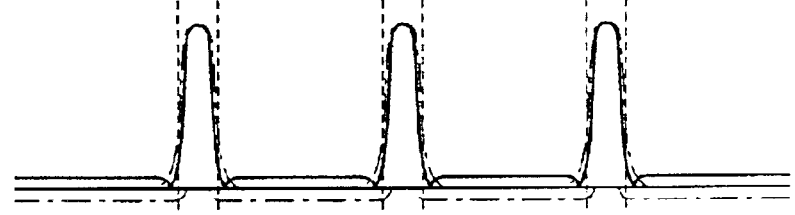

Thus, antiphase light components superpose and cancel with each other on the boundary between the bright line patterns 3 and the screen film 2 as shown in FIG. 8B so that the light intensity can be reduced on edges of exposed patterns and resolution of the pattern image can be increased.

The line width L of the bright line patterns 3 shown in FIGS. 1 and 2 preferably satisfies $0.20 \times (\lambda/NA) \leq L \leq 0.60 \times (\lambda/NA)$. If the line width L of the bright line patterns 3 is less than $0.20 \times (\lambda/NA)$, the light exposure must be increased to at least 10 times the general exposure in order to keep the dimension unchanged following focal change and the throughput of the exposure apparatus is reduced due to requirement for a long exposure time, leading to unavailability of industrial application. If the line width L of the bright line patterns 3 is in excess of $0.60 \times (\lambda/NA)$, exposure energy at the centers of the patterns is insufficient with respect to that on pattern edges particularly in defocusing, to result in incapability of pattern resolution.

In the process of inventing the pattern forming method according to this embodiment, the inventor has carried out the following experiments and simulations thereby finding presence of light intensity keeping the pattern dimension of a photoresist material following focal change.

A halftone phase-shift mask having a semi-screen film 2 capable of transmitting 6% of exposure light was employed as the photomask 5 shown in FIGS. 1 and 2 while setting the line width of bright line patterns 3 to 0.16 µm. The bright line patterns 3 of this photomask 5 were transferred to a negative photoresist material by exposure with a KrF excimer laser beam (wavelength: 248 nm) while setting a numerical aperture NA to 0.65 by ⅔ zonal illumination ($\sigma_{out}/\sigma_{in}=0.80/0.53$) through the exposure apparatus shown in FIG. 3. As a result of calculation under such conditions, an optical image having relative image intensity distribution shown in FIG. 9 was obtained.

Figure 9:
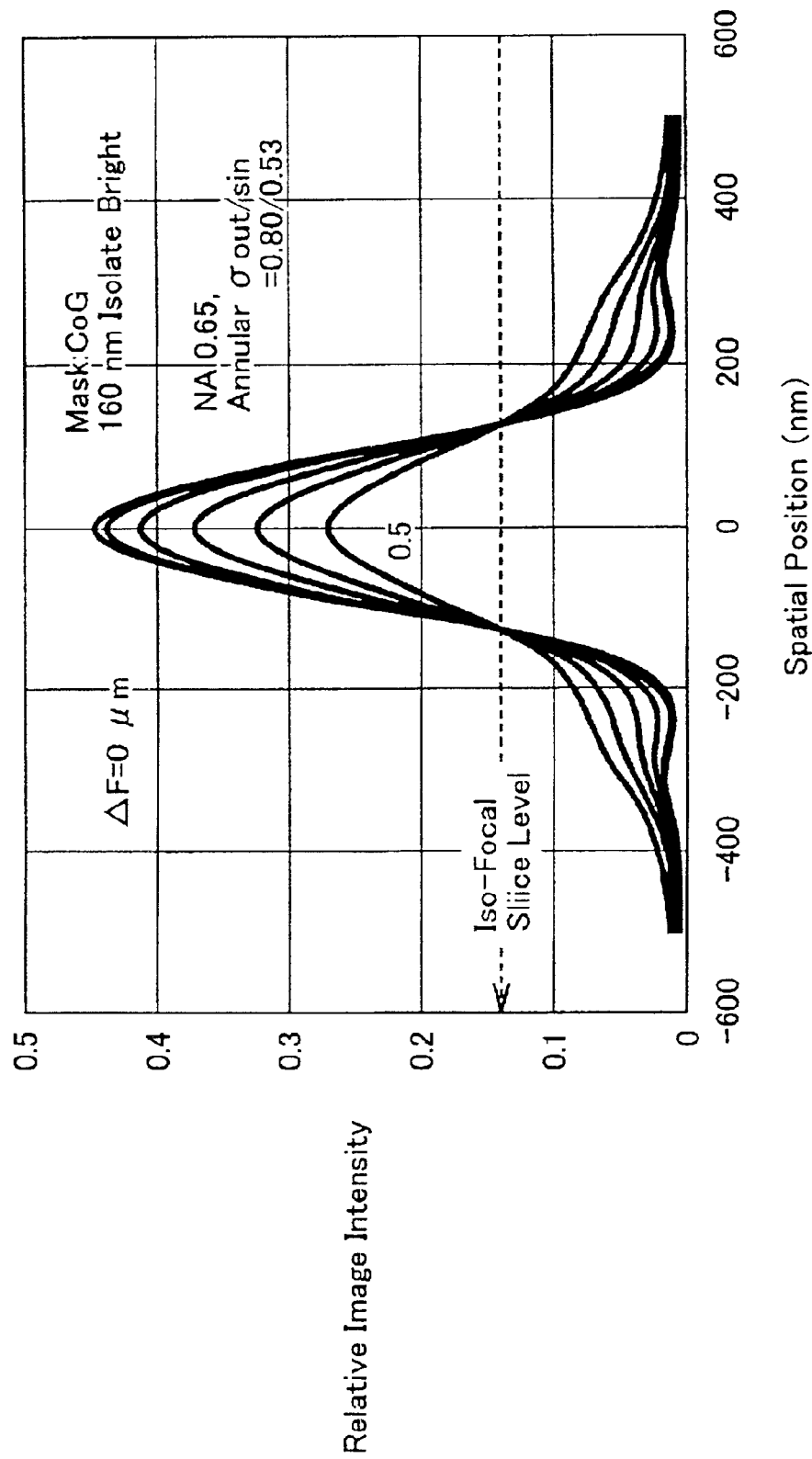
FIG. 9 is a diagram for illustrating iso-focal characteristics obtained in a photoresist material.

In the relative image intensity distribution shown in FIG. 9, the focal position was varied in the range of 0 to 0.5 µm. Parts having high image intensity correspond to exposed areas of the bright line patterns 3.

It has been recognized from the results shown in FIG. 9 that light intensity (iso-focal slice level) keeping the pattern dimension of a photoresist material unchanged following change of the focal position can be obtained by adjusting the light exposure. As to this light intensity (isofocal slice level), it has also been recognized that image quality ensuring pattern resolution is obtained when the relative light intensity distribution is within the range of at least 0.1 and not more than 0.25, i.e., within the range of at least four times and not more than 10 times the light exposure (Eth) photosensitizing the photoresist material 21b by exposure light transmitted through mask openings sufficiently larger than the wavelength λ of the exposure light and inverting solubility.

Figure 10:
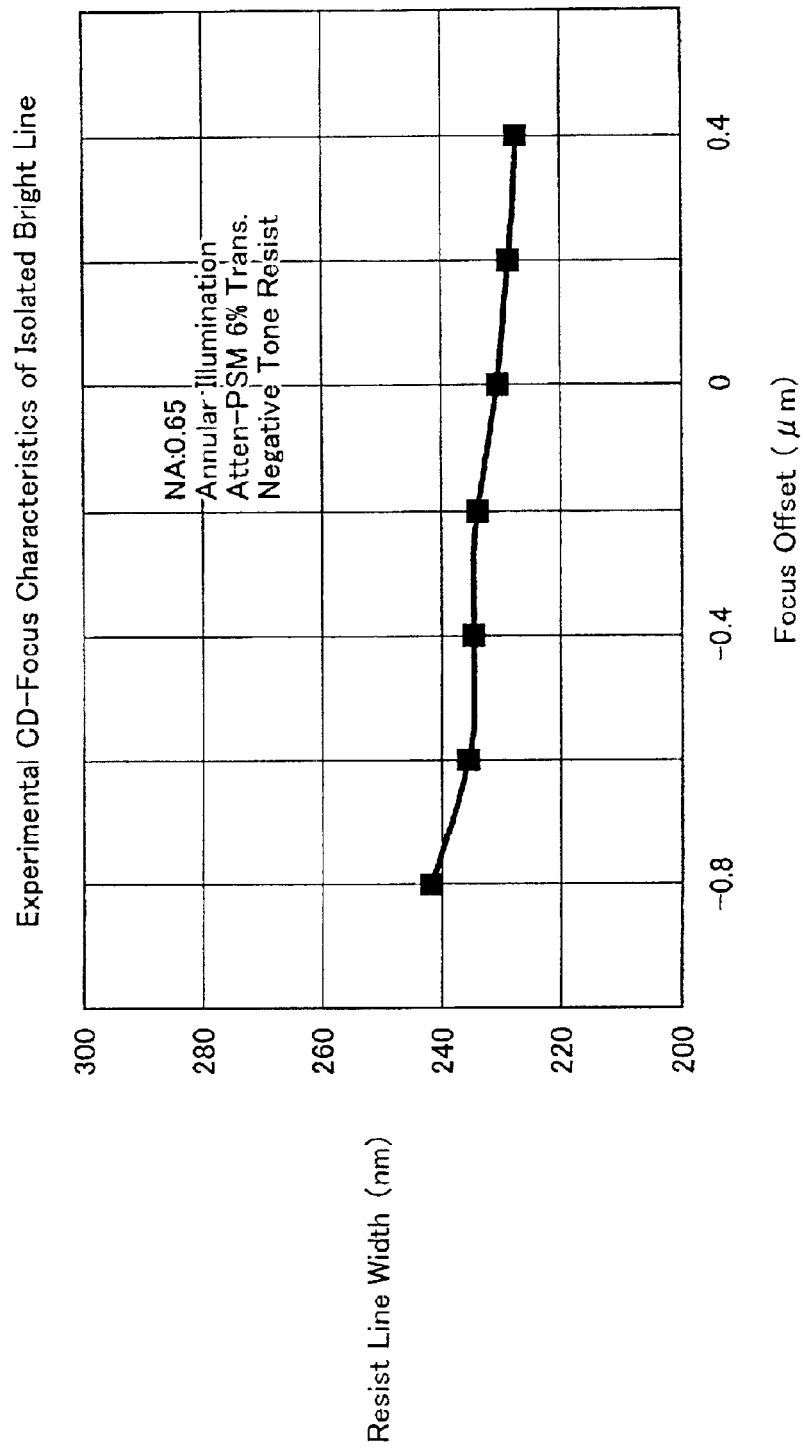
FIG. 10 illustrates an experimental result of CD-focus characteristics in an isolated bright line.

FIG. 10 shows the relation between the line width (resist line width) of the patterns of the photoresist material 21b and focus offset obtained by performing exposure in practice under the aforementioned conditions. Referring to FIG. 10, it has been recognized that the line width of the patterns is kept substantially unchanged following focal change.

Figure 11:
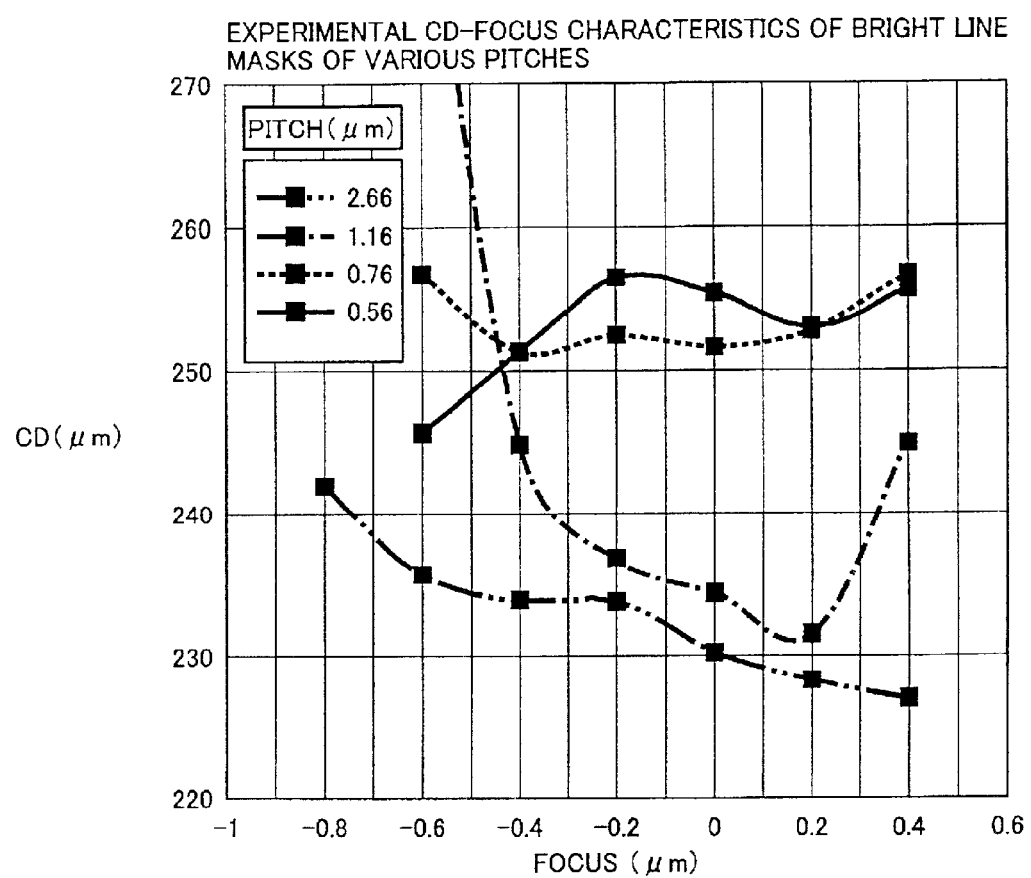
FIG. 11 illustrates experimental results of CD-focus characteristics of bright line masks of various pitches.
Figure 12:
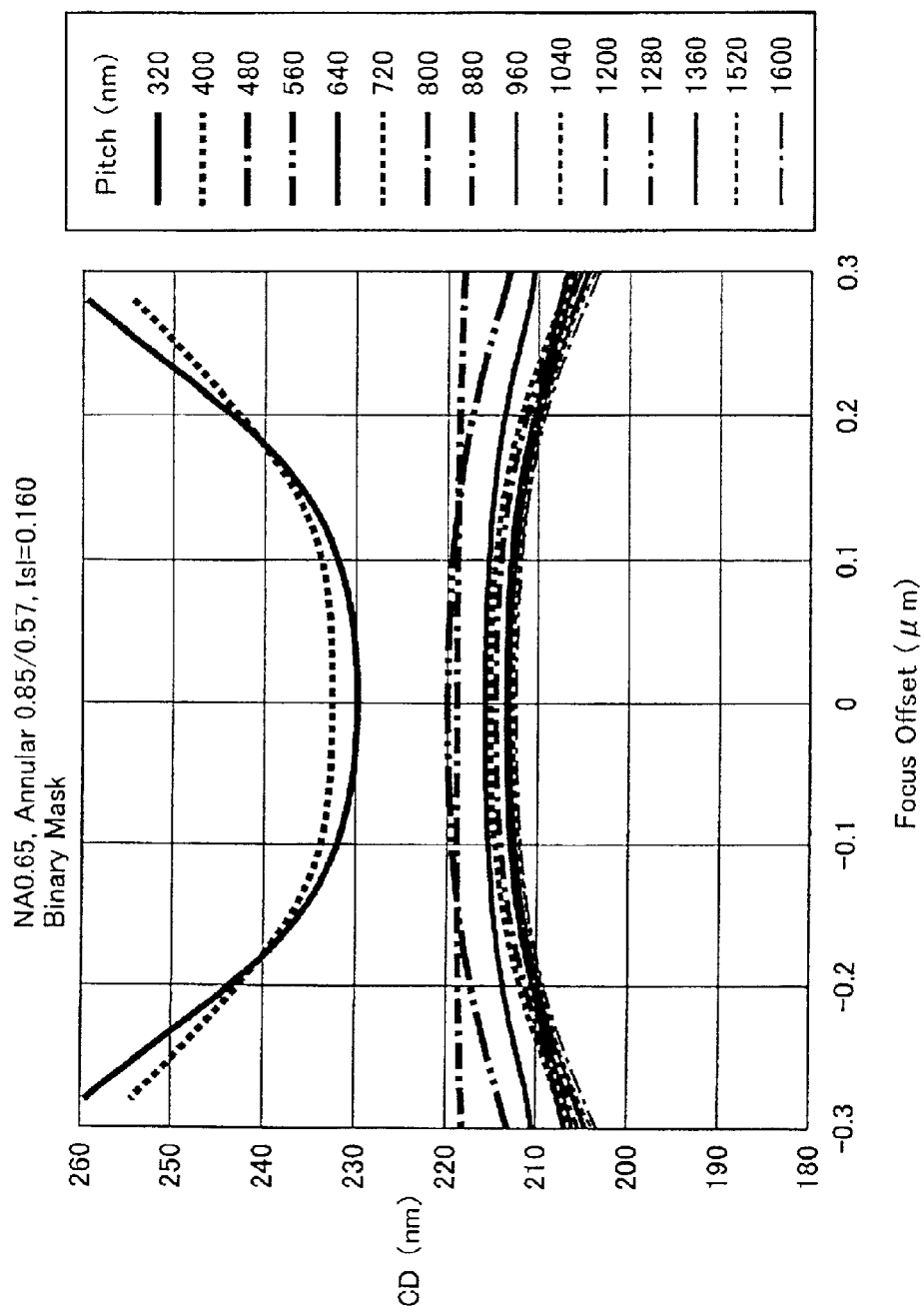
FIG. 12 illustrates results of calculation of CD-focus characteristics at various pitches of bright line patterns having a line width of 140 nm.

Experiments and calculation have been made as to the relation (CD-focus characteristics) between CDs (critical dimensions) and focus offset by performing exposure under the aforementioned conditions. FIGS. 11 and 12 show experimental and calculated values respectively. It has been recognized from the results shown in FIGS. 11 and 12 that the critical dimensions are kept substantially unchanged within the focus offset range of −0.2 to 0.2 µm also when pitches of bright line patterns are varied, to attain excellent CD-focus characteristics.

FIG. 13 shows distribution of dimensions of bright line images formed on exposed surfaces by performing exposure under the aforementioned conditions and forming repetitive patterns of bright and dark lines on photomasks while varying the widths of the bright and dark lines. Referring to FIG. 13, the uppermost row shows the line widths of the dark line patterns formed on the photomasks, the leftmost column shows the line widths of the bright line patterns formed on the photomasks, and the remaining rows and columns show the line widths of the images of the bright line patterns.

Referring to FIG. 13, the patterns having the mask dimensions shown by leftward slant lines exhibit DOF values of a least 0.5 μm, and the patterns having the mask dimensions shown by rightward slant lines exhibit DOF values of at least 0.6 μm. It is clearly understood from these results that a large DOF value can be obtained with respect to a substantially constant bright line image width regardless of the dark line width.

According to this embodiment, exposure is performed with light intensity capable of obtaining the characteristics keeping the pattern dimension of the photoresist material substantially unchanged following focal change, whereby remarkably excellent CD-focus characteristics can be obtained for reducing dimensional dispersion in actual transfer.

When exposure is performed with a light exposure of at least four times and not more than 10 times the light exposure (Eth), the finished pattern dimension of the photoresist material 21b differs from the pattern dimension on the photomask 5. Also in this case, however, design of the device pattern is not complicated due to the recent progress of the CAD technique.

(Second Embodiment)

While the first embodiment has been described with reference to the case of forming residual line patterns on a negative photoresist material, void line patterns are formed on a positive photoresist material in a second embodiment of the present invention. A pattern forming method according to the second embodiment is now described.

According to this embodiment, the exposure apparatus shown in FIG. 3 transfers the bright line patterns 3 of the photomask 5 shown in FIGS. 1 and 2 to the positive photoresist material 21b shown in FIG. 4 by exposure. At this time, the bright line patterns 3 of the photomask 5 are transferred to the photoresist material 21b with a light exposure of at least four times and not more than 10 times the light exposure (Eth) photosensitizing the photoresist material 21b and inverting solubility. This exposure is performed with light intensity keeping the pattern dimension of the photoresist material 21b substantially unchanged following focal change. Other optical conditions in exposure, the mask structure, the pattern dimensions etc. are identical to those in the first embodiment. Thereafter the photoresist material 21b is developed.

Figure 14:
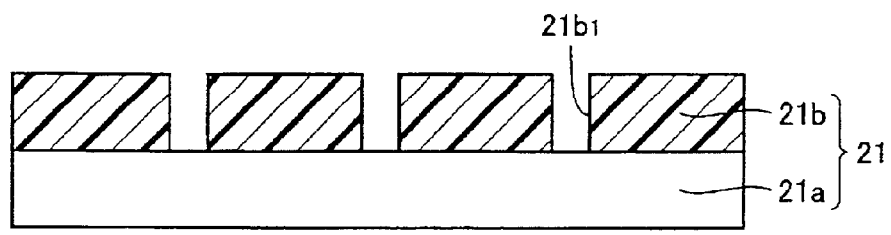
FIG. 14 is a schematic sectional view showing a pattern forming method according to a second embodiment of the present invention.
Figure 15:
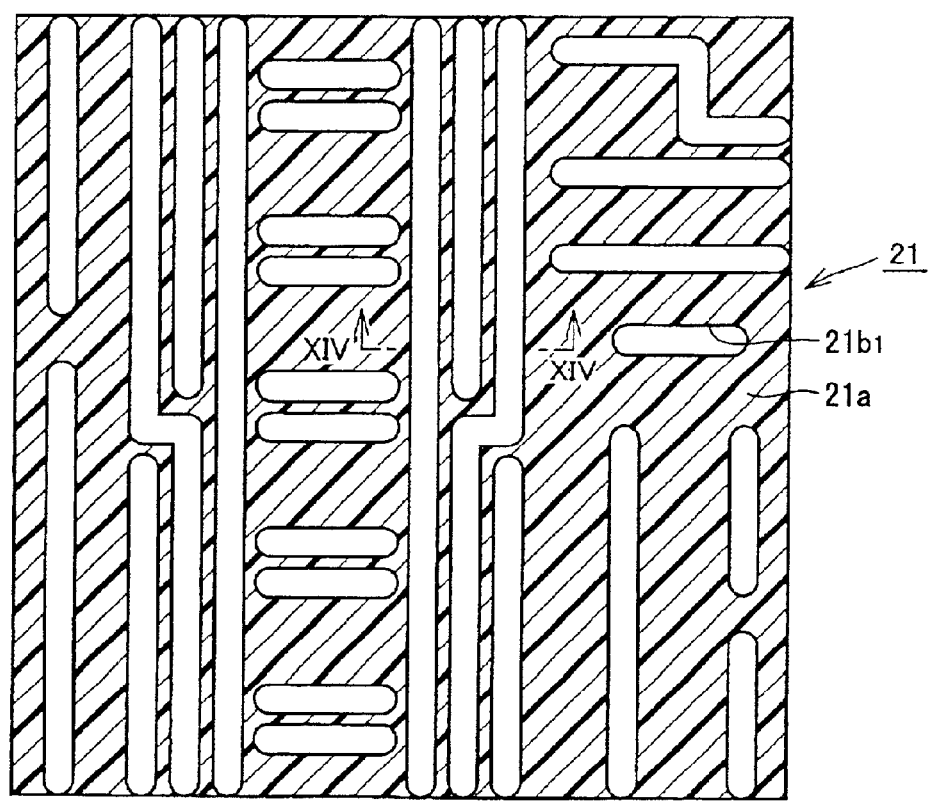
FIG. 15 is a schematic plan view showing the structure of a resist pattern formed by the pattern forming method according to the second embodiment of the present invention.

Referring to FIG. 14, only exposed areas of the bright line patterns 3 are removed due to the aforementioned development, for forming void line patterns $21b_1$. FIG. 15 shows planar shapes of the void line patterns $21b_1$ corresponding to the patterns 3 of the photomask 5 shown in FIG. 1. In this state, the line width L of the void line patterns $21b_1$ is 0.23 μm, for example.

FIG. 14 corresponds to a sectional view taken along the line XIV—XIV in FIG. 15.

Figure 16:
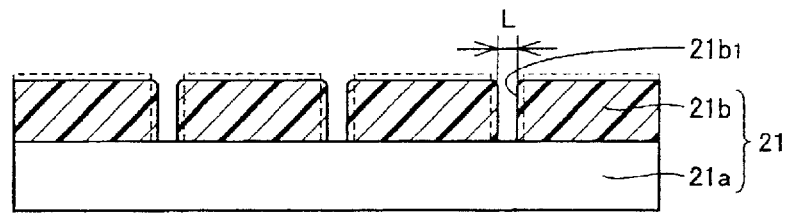
FIG. 16 is a schematic sectional view for illustrating thermal sagging.

Thereafter thermal sagging is performed on the photoresist material 21b, for example, in order to further reduce the line width L of the void line patterns $21b_1$. In this thermal sagging, the line width L of the void line patterns $21b_1$ is reduced as shown in FIG. 16 by flowing the photoresist material 21b at a temperature of 100° C. to 200° C., for example. The line width L of the void line patterns $21b_1$ subjected to this thermal sagging is reduced to 0.13 μm, for example.

In place of the aforementioned thermal sagging, the line width L of the void line patterns $21b_1$ may be reduced with a chemically reactive liquid material. This method is now described.

Figure 17:
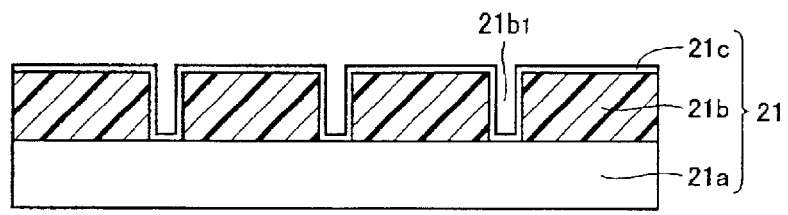
FIGS. 17 to 19 are step diagrams for illustrating framing by application of an agent.
Figure 18:
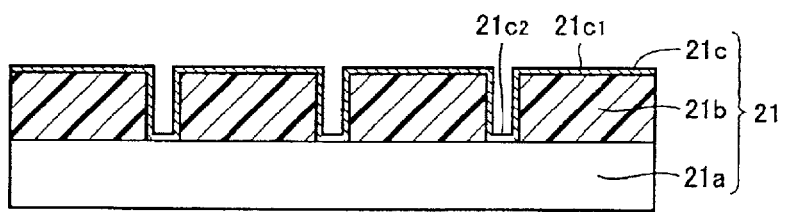
Figure 19:
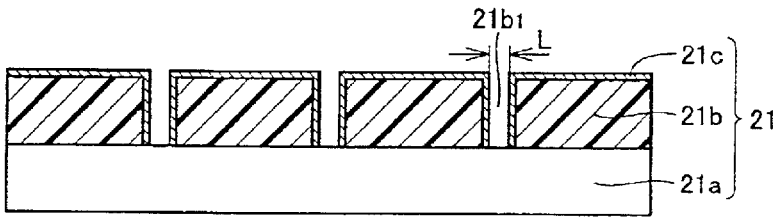

FIGS. 17 to 19 are schematic sectional views showing steps in the method of reducing the line width L of the void line patterns $21b_1$ with a chemically reactive liquid material. Referring to FIG. 17, a chemically reactive liquid material 21c is applied to the overall surfaces of the void line patterns $21b_1$ formed by developing the photoresist material 21b. The chemically reactive liquid material 21c consists of a material progressing cross-linking reaction with acid resulting from the photoresist material 21b. Therefore, the applied liquid material 21c reacts with the photoresist material 21b following prescribed treatment.

Referring to FIG. 18, the applied liquid material 21c reacts with the photoresist material 21b in portions in contact with the photoresist material 21b due to the aforementioned prescribed treatment. At this time, parts of the applied liquid material 21c located on the bottoms of the void line patterns $21b_1$ are not in contact with the photoresist material 21b, to cause no cross-linking reaction. Thereafter unreacted portions 21c2 of the applied liquid material 21c are removed by chemical treatment.

Referring to FIG. 19, the line width L of the void line patterns $21b_1$ can be reduced due to the aforementioned treatment.

Also in this embodiment, exposure is performed with light intensity keeping the pattern dimension of the photoresist material 21b substantially unchanged following focal change, whereby remarkably excellent CD-focus characteristics can be obtained for reducing dimensional dispersion in actual transfer.

When exposure is performed with a light exposure of at least four times and not more than 10 times the light exposure (Eth), the finished pattern dimension of the photoresist material 21b differs from the pattern dimension on the photomask 5. Also in this case, however, design of the device pattern is not complicated due to the recent progress of the CAD technique.

(Third Embodiment)

While fine bright line patterns are exposed with the light exposure of at least four times and not more than 10 times the light exposure (Eth) according to each of the first and second embodiments, the exposure light quantity is excessively increased in exposed areas of relatively large bright line patterns to deteriorate formability (DOF) for these bright line patterns when the relatively large bright line patterns are exposed with this light exposure. A third embodiment of the present invention is now described with reference to a technique capable of preventing such deterioration of formability in exposure of a photomask pattern including fine and large bright line patterns.

A photomask 5A shown in FIG. 20B is first prepared to have a mask pattern 1 obtained by extracting only fine bright line patterns 3A having a substantially constant width L as opening patterns from design patterns of various dimensions provided on a photomask shown in FIG. 20A. The line width L of the fine bright line patterns 3A preferably satisfies at least $0.20 \times (\lambda/NA) \leq L \leq 0.60 \times (\lambda/NA)$. Another photomask 5B shown in FIG. 20C is also prepared to have a mask pattern 2 including the remaining extracted patterns 3B as opening patterns.

Figure 21:
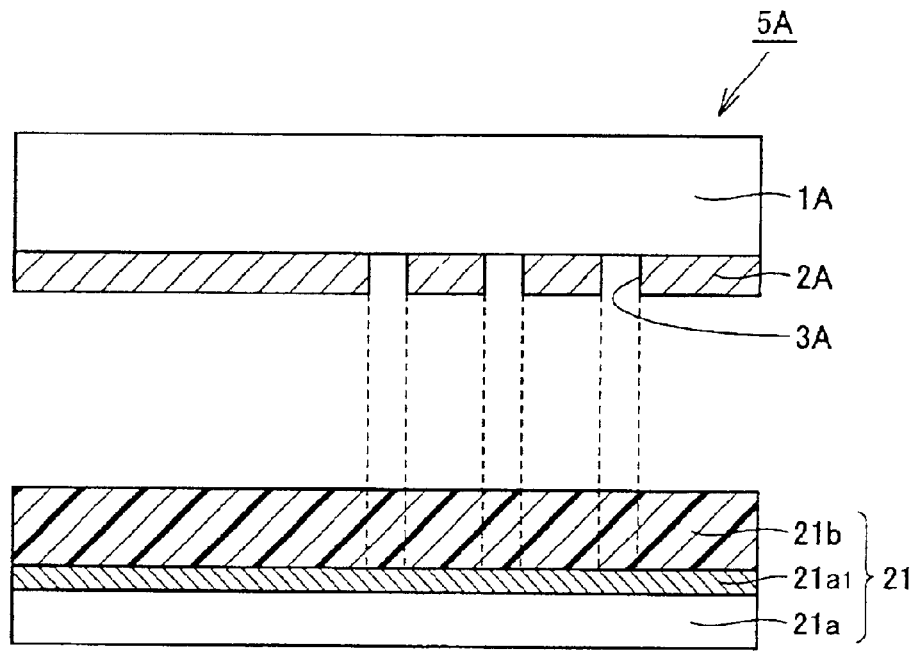
FIGS. 21 to 25 are schematic sectional views successively showing steps in a pattern forming method according to the third embodiment of the present invention.

These two photomasks 5A and 5B are employed for the following pattern formation:

Referring to FIG. 21, the exposure apparatus shown in FIG. 3 transfers the fine bright line patterns 3A of the first photomask 5A shown in FIG. 20B to a negative photoresist material 21b by exposure with a light exposure of at least four times and not more than 10 times the light exposure (Eth) photosensitizing the photoresist material 21b and inverting solubility. This light exposure attains light intensity keeping the pattern dimension of the photoresist material 21b substantially unchanged following focal change. The remaining optical conditions for this exposure are identical to those in the first embodiment. FIG. 21 corresponds to a sectional view of the photomask 5A taken along the line XXI—XXI in FIG. 20B.

Figure 22:
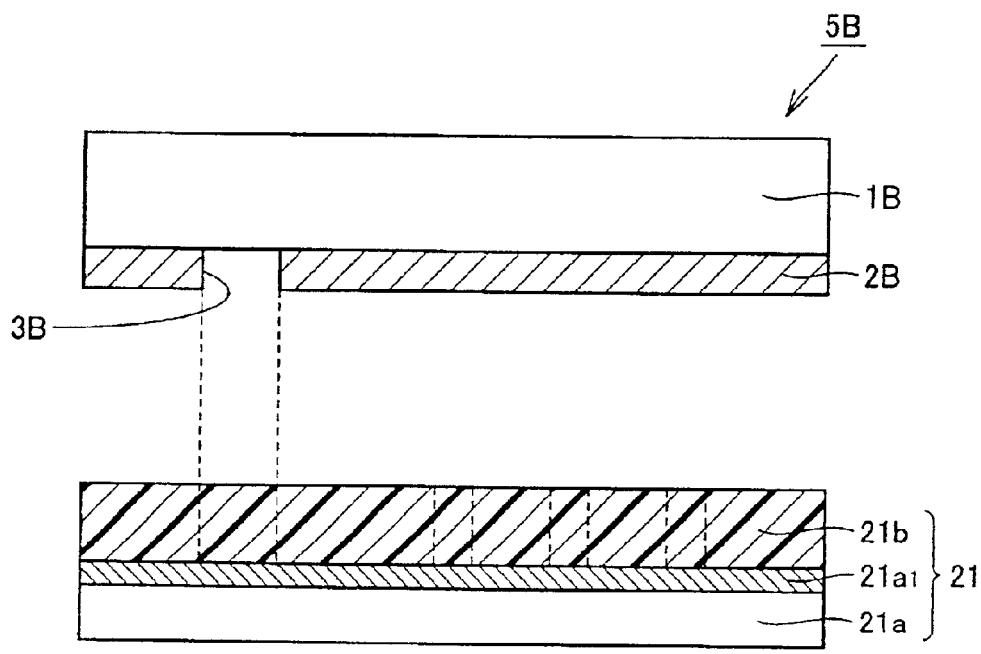

Referring to FIG. 22, the patterns 3B of the second photomask 5B shown in FIG. 20C are continuously transferred to the photoresist material 21b by exposure with a general light exposure (=Eth/(0.3 to 0.4)) after the aforementioned exposure without through development. Optical conditions other than the light exposure are identical to those for the exposure shown in FIG. 21. After the second exposure, the photoresist material 21b is developed. FIG. 22 corresponds to a sectional view of the photomask 5B taken along the line XXII—XXII in FIG. 20C.

Figure 23:
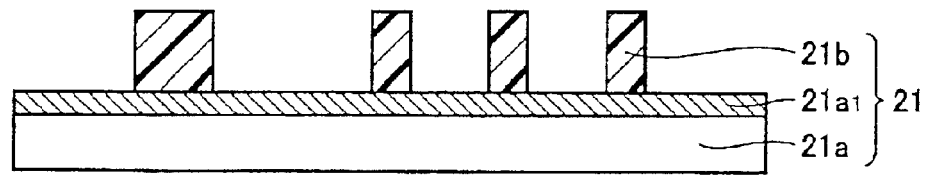

Referring to FIG. 23, areas of the photoresist material 21b photosensitized by exposure light are left to define residual line patterns 21b due to the aforementioned development. The residual line patterns 21b are employed as masks for anisotropically etching a lower etched film (e.g., a hard mask) $21a_1$.

Figure 24:
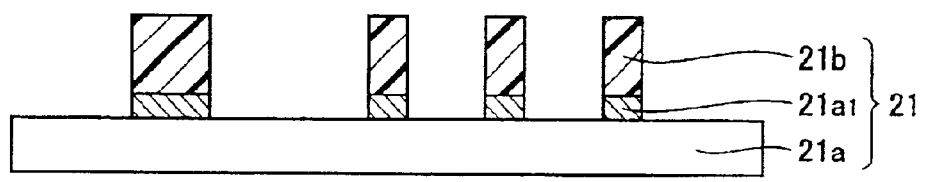
Figure 25:
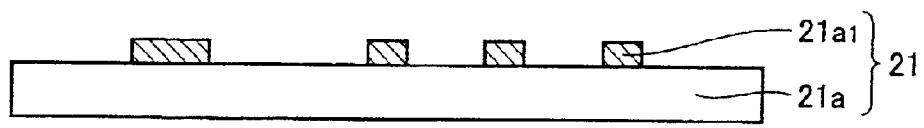

Referring to FIG. 24, the etched film $21a_1$ is patterned due to the anisotropic etching. Thereafter the residual line patterns 21b are removed by ashing, for example, as shown in FIG. 25.

After the photoresist material 21b is developed as shown in FIG. 23, the aforementioned partial ashing may be further performed thereby further reducing the line width of the residual line patterns 21b.

According to this embodiment, only the fine bright line patterns 3A can be exposed by exposure with light intensity keeping the pattern dimension of the photoresist material 21b substantially unchanged following focal change. Therefore, the fine bright line patterns 3A can be formed with excellent dimensional controllability.

The large patterns 3B, exposed with the light exposure smaller than that for the fine bright line patterns 3A, can also be formed with excellent controllability.

(Fourth Embodiment)

While the residual line patterns are formed on the negative photoresist material 21b in the aforementioned third embodiment, void line patterns may be formed on a positive photoresist material. In this case, the void line patterns can be formed by employing a positive photoresist material 21b similarly to the second embodiment and performing double exposure similarly to the third embodiment.

The line width of the void line patterns can be reduced by thermal sagging or the method employing a chemically reactive liquid material described with reference to the second embodiment.

Effects similar to those of the third embodiment can be attained according to this embodiment.

(Fifth Embodiment)

While development is performed after continuously performing exposure twice in each of the aforementioned third and fourth embodiments, patterns may alternatively be formed by performing first development after first exposure and second development after second exposure. A fifth embodiment of the present invention is now described with reference to such pattern formation.

Figure 26B:
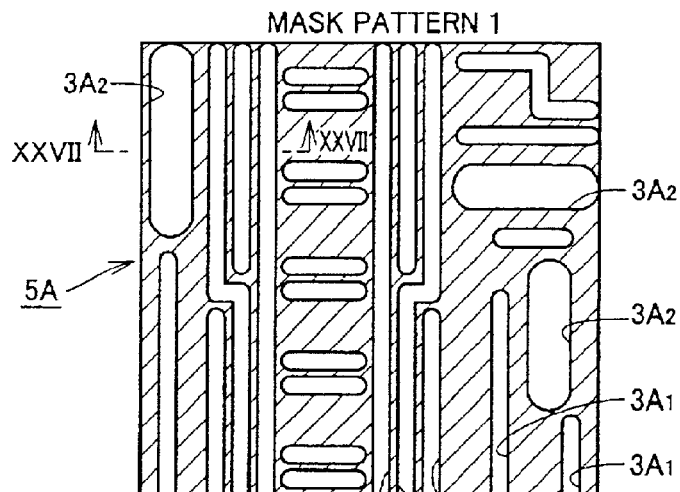
FIGS. 26A to 26C are diagrams for illustrating a method of extracting patterns from design patterns according to a fifth embodiment of the present invention.
Figure 26A:
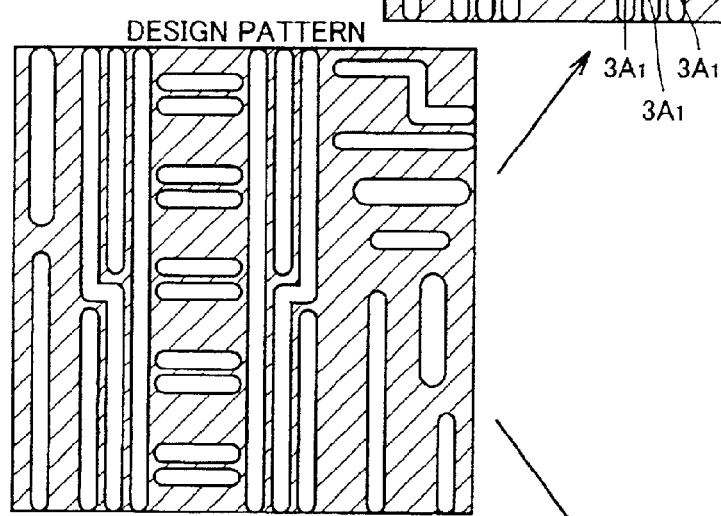
Figure 26C:
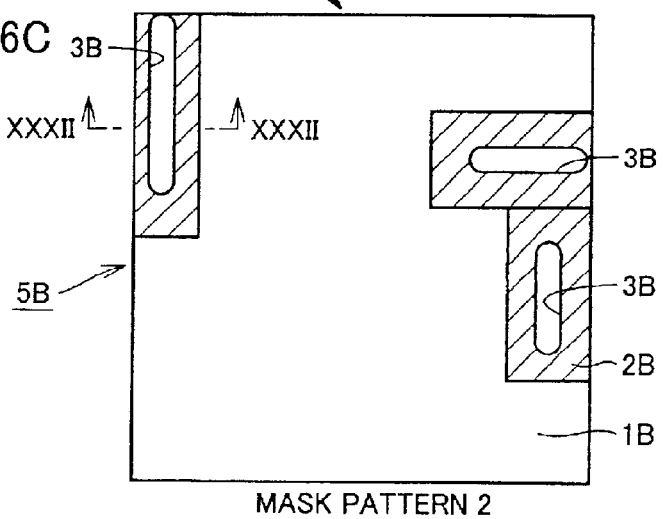

First, a first photomask 5A having a mask pattern 1 shown in FIG. 26B is prepared from design patterns of various dimensions provided on a photomask shown in FIG. 26A. In the photomask 5A, fine bright line patterns $3A_1$ are extracted as opening patterns having the original size while the remaining large patterns $3A_2$ are extracted as oversized opening patterns. The line width L of the fine bright line patterns $3A_1$ preferably satisfies at least 0.20×(λ/NA) ≦L≦0.60×(λ/NA). A second photomask 5B is prepared as shown in FIG. 26C to have a mask pattern 2 obtained by extracting only large patterns from the design patterns shown in FIG. 20A as opening patterns 3B with no oversizing.

Figure 27:
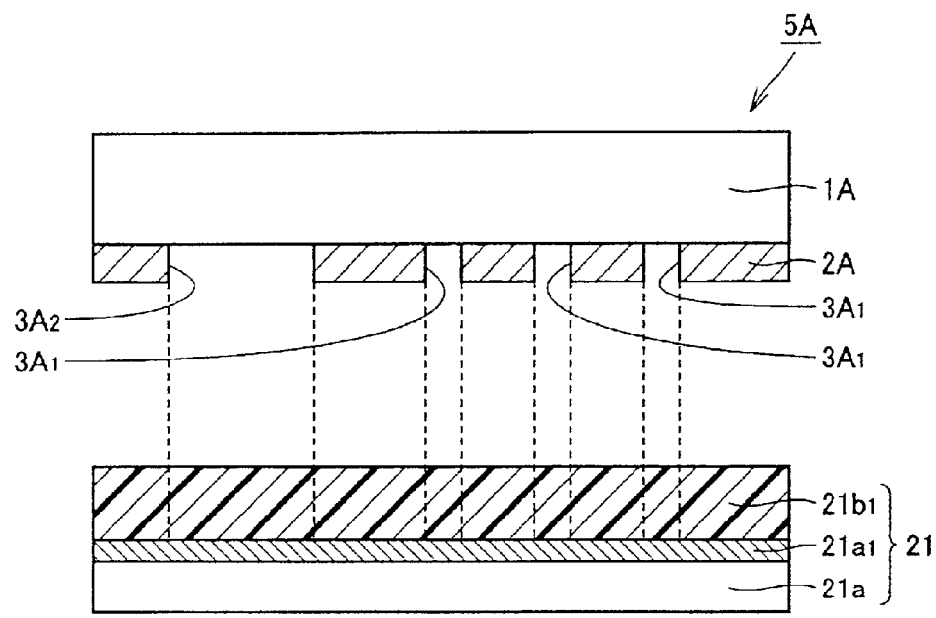
FIGS. 27 to 34 are schematic sectional views successively showing steps in a pattern forming method according to the fifth embodiment of the present invention.

The first and second photomasks 5A and 5B are employed for the following pattern formation:

Referring to FIG. 27, the patterns $3A_1$ and $3A_2$ of the photomask 5A having the mask pattern 1 shown in FIG. 26B are transferred to a negative photoresist material $21b_1$ by exposure with a light exposure of at least four times and not more than 10 times the light exposure (Eth) photosensitizing the negative photoresist material $21b_1$ and inverting solubility. This light exposure attains light intensity keeping the pattern dimension of the negative photoresist material $21b_1$ substantially unchanged following focal change. The remaining optical conditions in this exposure are identical to those in the first embodiment. Thereafter the photoresist material $21b_1$ is developed.

FIG. 27 corresponds to a sectional view of the photomask 5A taken along the line XXVII—XXVII in FIG. 26B.

Figure 28:
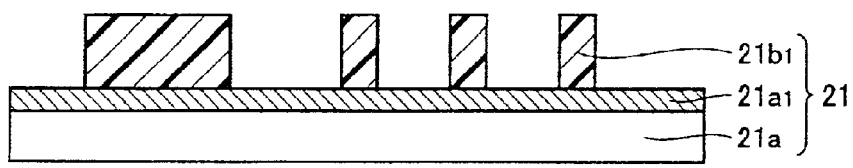

Referring to FIG. 28, only exposed areas of the patterns $3A_1$ and $3A_2$ are left due to the development. The resist pattern $21b_1$ is employed as a mask for anisotropically etching a lower etched film (e.g., a hard mask) $21a_1$.

Figure 29:
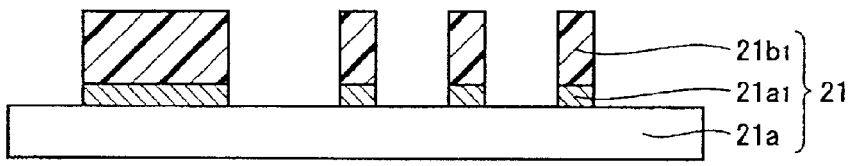

Referring to FIG. 29, the etched film $21a_1$ is patterned due to the anisotropic etching. Thereafter the resist pattern $21b_1$ is removed by ashing, for example.

Figure 30:
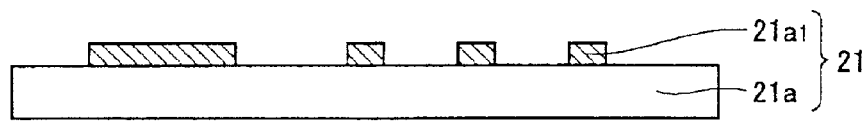

Referring to FIG. 30, the surface of the patterned etched film $21a_1$ is exposed by the aforementioned ashing.

Figure 31:
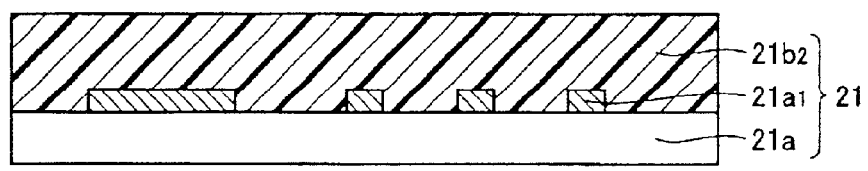

Referring to FIG. 31, a negative photoresist material $21b_2$ is applied to the overall surface.

Figure 32:
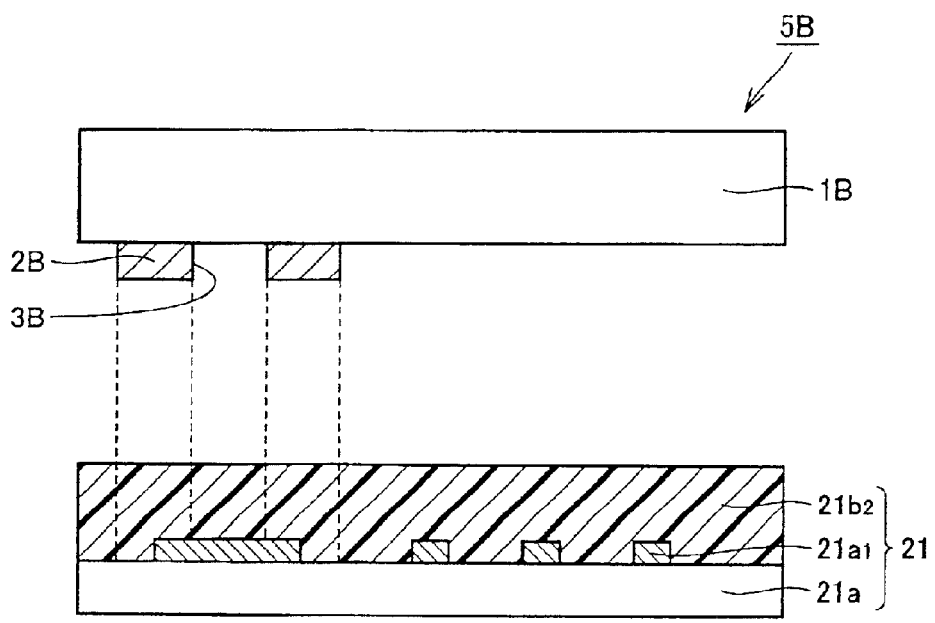

Referring to FIG. 32, the patterns 3B formed on the photomask 5B shown in FIG. 26C are transferred to the photoresist material $21b_2$ by exposure with a general exposure (=Eth/(0.3 to 0.4)). Optical conditions other than the light exposure are identical to those for the exposure shown in FIG. 27. Thereafter the photoresist material $21b_2$ is developed.

Figure 33:
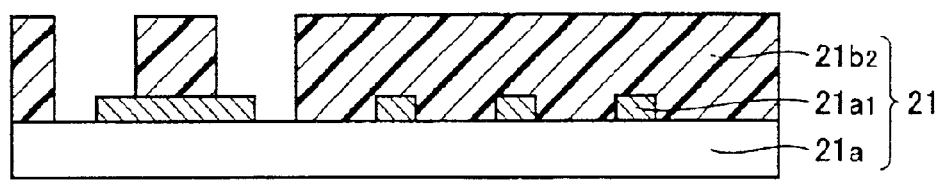

Referring to FIG. 33, the photoresist material $21b_2$ is patterned due to this development. The patterned photoresist material $21b_2$ is employed as a mask for anisotropically etching the etched film $21a_1$.

Figure 34:
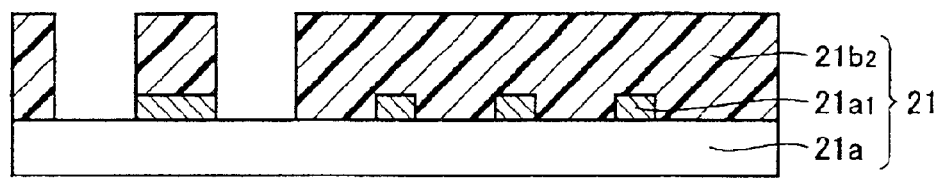

Referring to FIG. 34, the oversized patterns are reduced to the original dimension. Thereafter the photoresist material 21b2 is removed by ashing, for example, thereby transferring the design patterns shown in FIG. 26A to the etched film 21a1.

According to this embodiment, effects similar to those of the fourth embodiment can be attained.

(Sixth Embodiment)

While residual line patterns are formed with a negative photoresist material in the fifth embodiment, void line patterns can be formed with a positive photoresist material. A sixth embodiment of the present invention is now described with reference to this method.

Figure 35B:
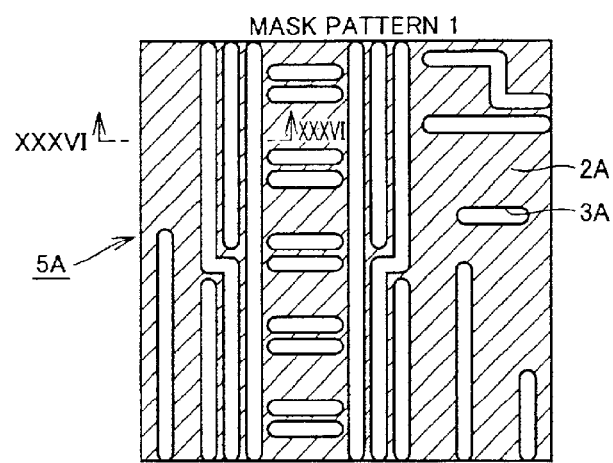
FIGS. 35A to 35C are diagrams for illustrating a method of extracting patterns from design patterns according to a sixth embodiment of the present invention.
Figure 35A:
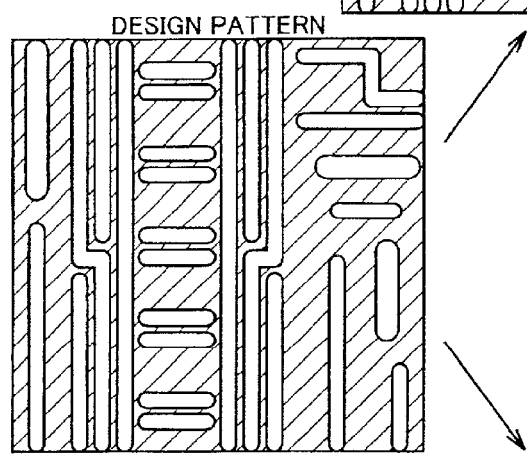
Figure 35C:
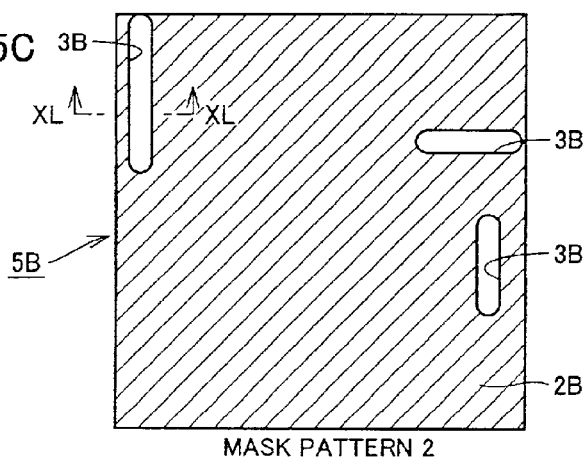

A photomask 5A shown in FIG. 35B is first prepared to have a mask pattern 1 obtained by extracting only fine bright line patterns 3A having a substantially constant width L as opening patterns from design patterns of various dimensions provided on a photomask shown in FIG. 35A. The line width L of the fine bright line patterns 3A preferably satisfies at least $0.20\times(\lambda/NA) \leq L \leq 0.60\times(\lambda/NA)$. Another photomask 5B shown in FIG. 35C is also prepared to have a mask pattern 2 including the remaining extracted patterns 3B as opening patterns.

Figure 36:
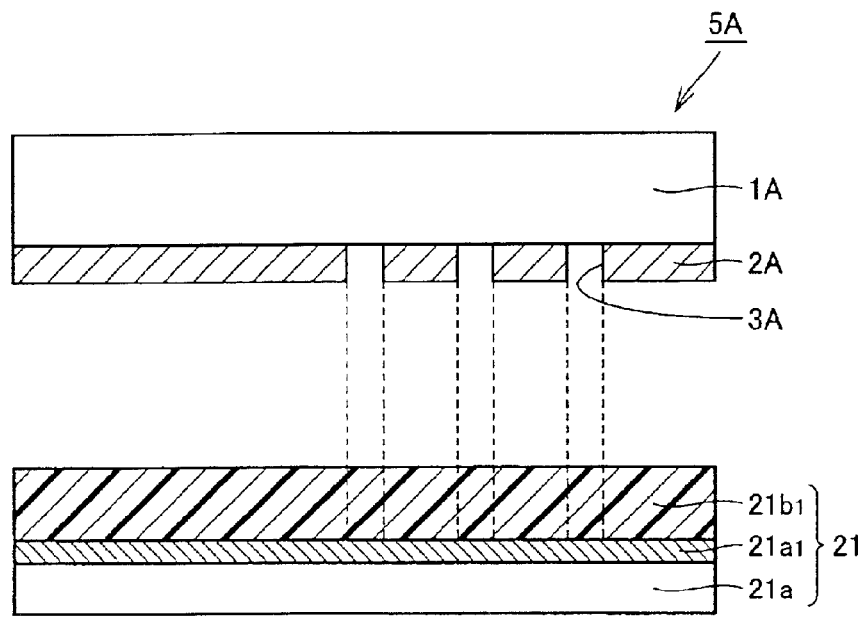
FIGS. 36 to 43 are schematic sectional views successively showing steps in a pattern forming method according to the sixth embodiment of the present invention.

These two photomasks 5A and 5B are employed for the following formation of void line patterns:

Referring to FIG. 36, the fine bright line patterns 3A of the photomask 5A shown in FIG. 35B are transferred to a positive photoresist material $21b_1$ by exposure with a light exposure of at least four times and not more than 10 times the light exposure (Eth) photosensitizing the photoresist material $21b_1$ and inverting solubility. This light exposure attains light intensity keeping the pattern dimension of the photoresist material $21b_1$ substantially unchanged following focal change. The remaining optical conditions for the exposure are identical to those in the second embodiment. Thereafter the photoresist material $21b_1$ is developed. FIG. 36 corresponds to a sectional view of the photomask 5A taken along the line XXXVI—XXXVI in FIG. 35B.

Figure 37:
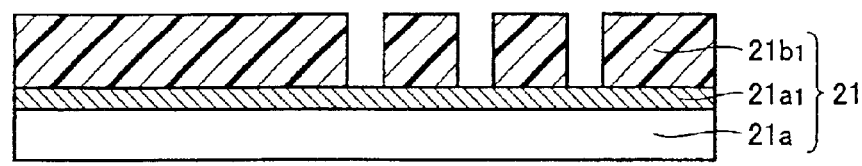

Referring to FIG. 37, only exposed areas of the fine bright line patterns 3A are removed due to the development. The resist pattern $21b_1$ is employed as a mask for anisotropically etching a lower etched film (e.g., a hard mask) $21a_1$.

Figure 38:
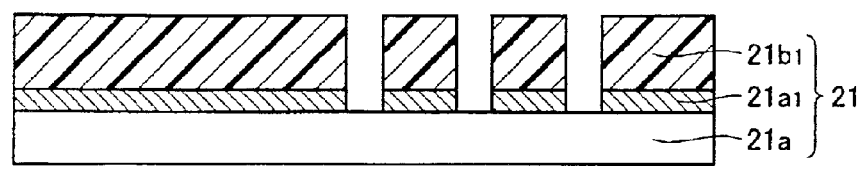

Referring to FIG. 38, void line patterns corresponding to the fine bright line patterns 3A are formed on the etched film $21a_1$. Thereafter the resist pattern $21b_1$ is removed by ashing, for example.

Figure 39:
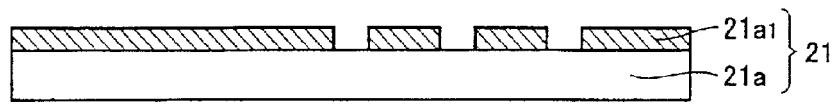

Referring to FIG. 39, the surface of the patterned etched film $21a_1$ is exposed by the aforementioned ashing.

Figure 40:
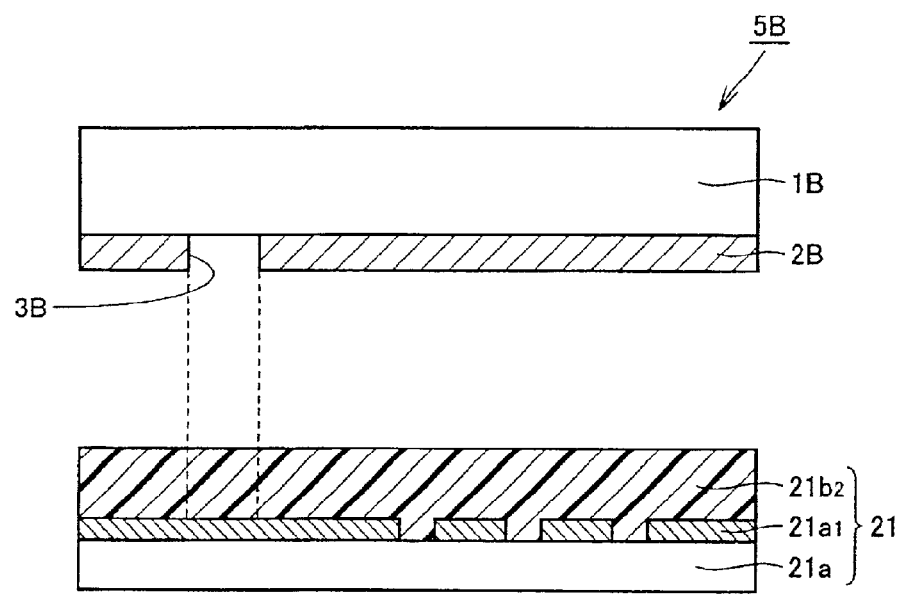

Referring to FIG. 40, a positive photoresist material $21b_2$ is applied to the overall surface. Thereafter the patterns 3B formed on the photomask 5B shown in FIG. 35C are transferred to the photoresist material $21b_2$ by exposure with a general light exposure (=Eth/(0.3 to 0.4)). Optical conditions other than the light exposure are identical to those for the exposure shown in FIG. 36. Thereafter the photoresist material $21b_2$ is developed.

Figure 41:
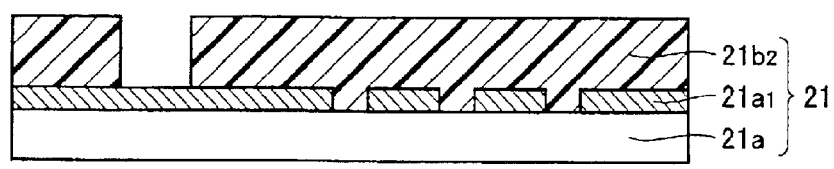

Referring to FIG. 41, void line patterns corresponding to the patterns 3B are formed on the photoresist material $21b_2$ due to this development. Parts of the etched film $21a_1$ exposed from the void line patterns are anisotropically etched.

Figure 42:
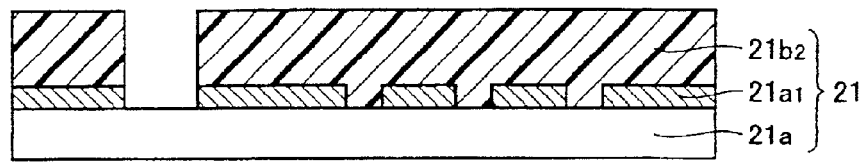
Figure 43:
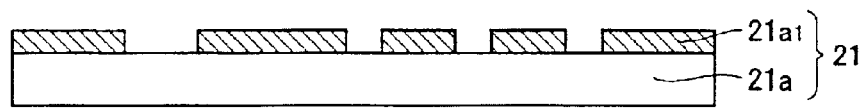

Referring to FIG. 42, void line patterns corresponding to the patterns 3B are formed on the etched film $21a_1$ due to this etching. Thereafter the photoresist material $21b_2$ is removed by ashing, for example, thereby transferring the design patterns shown in FIG. 43 to the etched film $21a_1$.

Also according to this embodiment, effects similar to those of the fourth embodiment can be attained.

According to this embodiment, no pattern fogging results from first exposure and second exposure dissimilarly to the third and fourth embodiments performing double exposure, whereby the proximity distance between large and small patterns can be reduced.

(Seventh Embodiment)

Gate electrodes of MOS (metal oxide semiconductor) transistors can be formed by any of the methods according to the aforementioned first to sixth embodiments. The structures of the MOS transistors and a method of forming the gate electrode patterns thereof are now described.

Figure 44:
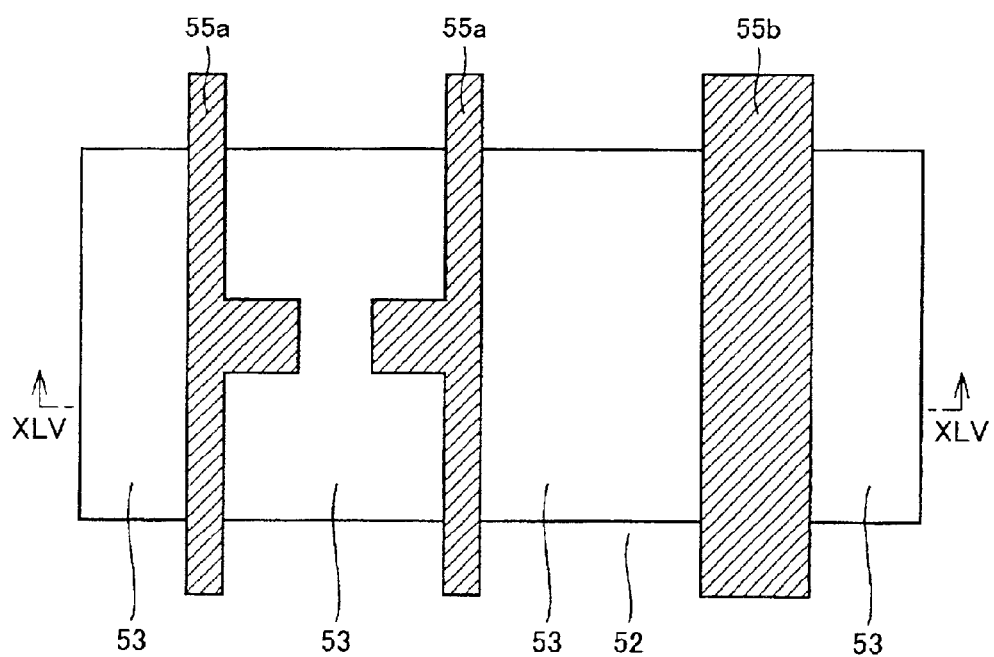
FIG. 44 is a schematic plan view showing the structures of MOS transistors formed by a pattern forming method according to a seventh embodiment of the present invention.
Figure 45:
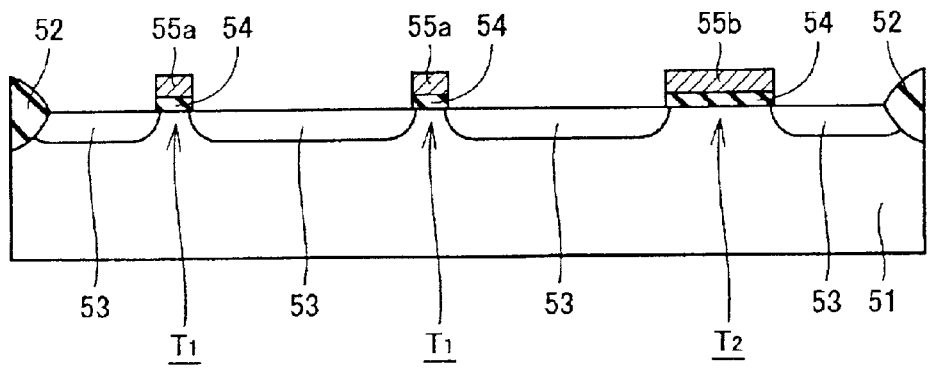
FIG. 45 is a schematic sectional view taken along the line XLV—XLV in FIG. 44.

Referring to FIGS. 44 and 45, element isolation films (field oxide films) 52 are formed for electrically isolating regions of the surface of a semiconductor substrate 51 from each other. A plurality of MOS transistors $T_1$ and $T_2$ are formed on active regions electrically isolated by the element isolation films 52 from each other respectively.

Each of the MOS transistors $T_1$ has a pair of source/drain regions 53, a gate insulator film 54 and a gate electrode 55a. The pair of source/drain regions 53 are formed on the surface of the semiconductor substrate 51 at a prescribed distance. The gate electrode 55a is formed on a region held between the pair of source/drain regions 53 through the gate insulator film 54.

The MOS transistor $T_2$ also has a pair of source/drain regions 53, a gate insulator film 54 and a gate electrode 55b. The pair of source/drain regions 53 are formed on the surface of the semiconductor substrate 51 at a prescribed distance. The gate electrode 55b is formed on a region held between the pair of source/drain regions 53 through the gate insulator film 54.

The gate electrodes 55a and 55b of the MOS transistors $T_1$ and $T_2$ have different line widths. The gate electrodes 55a have fine line patterns, while the gate electrode 55b has a wider pattern.

Figure 46:
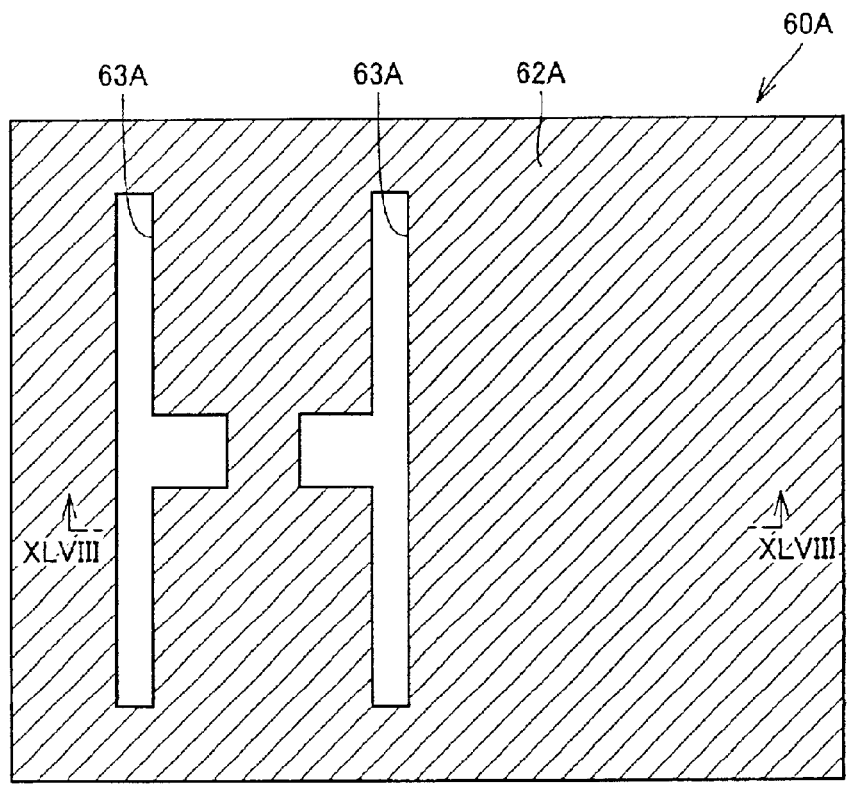
FIG. 46 is a schematic plan view showing the structure of a first photomask employed in the pattern forming method according to the seventh embodiment of the present invention.
Figure 47:
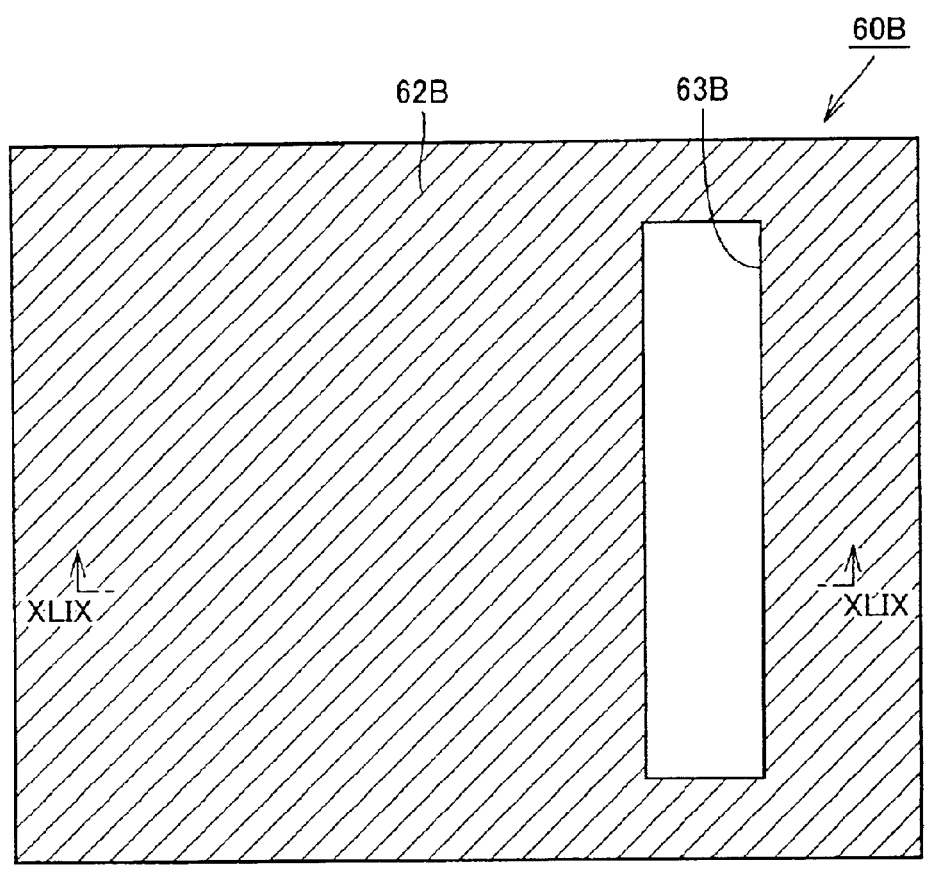
FIG. 47 is a schematic plan view showing the structure of a second photomask employed in the pattern forming method according to the seventh embodiment of the present invention.

In order to form the gate electrodes 55a and 55b, a photomask 60A shown in FIG. 46 is prepared by extracting only fine-line gate electrode patterns 63A from design patterns of a photomask while a photomask 60B shown in FIG. 47 is prepared to include the remaining wide gate electrode pattern 63B, as described with reference to the third embodiment.

The gate electrode patterns 63A and 63B are opening patterns (bright line patterns) formed on screen films 62A and 62B respectively. The line width L of the gate electrode patterns 63A preferably satisfies at least $0.20\times(\lambda/NA) \leq L \leq 0.60\times(\lambda/NA)$.

Figure 48:
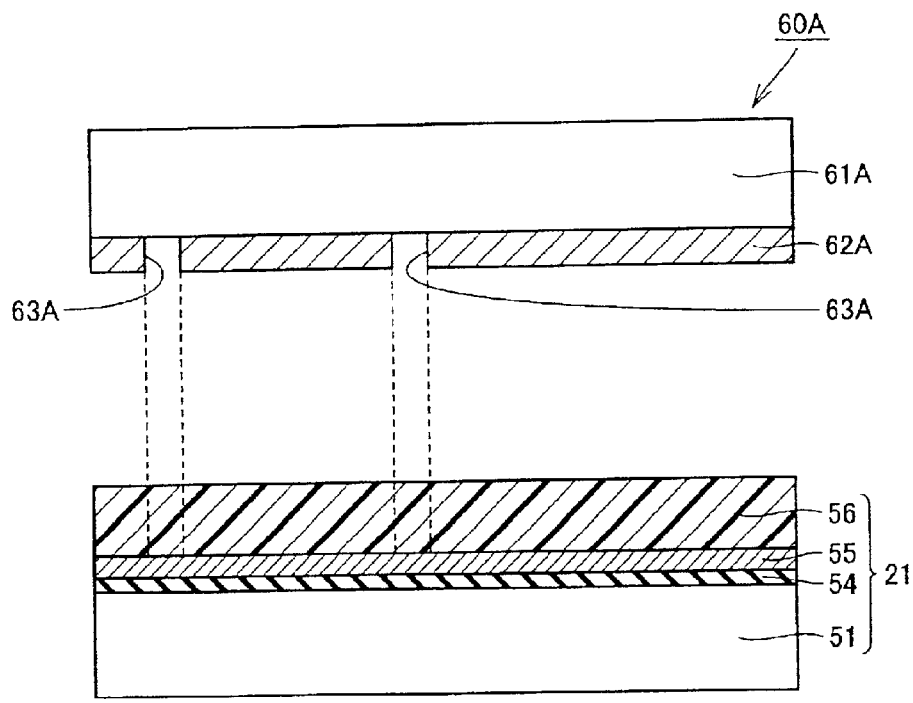
FIGS. 48 to 52 are schematic sectional views successively showing steps in the pattern forming method according to the seventh embodiment of the present invention.

The aforementioned photomasks 60A and 60B are employed for forming the gate electrodes 55a and 55b as follows:

Referring to FIG. 48, the gate electrode patterns 63A of the photomask 60A shown in FIG. 46 are transferred to a negative photoresist material 56 by exposure with a light exposure of at least four times and not more than 10 times the light exposure (Eth) photosensitizing the photoresist material 56 and inverting solubility. This light exposure attains light intensity keeping the pattern dimension of the photoresist material 56 substantially unchanged following focal change. The remaining optical conditions for the exposure are identical to those in the first embodiment. FIG. 48 corresponds to a sectional view of the photomask 60A taken along the line XLVIII—XLVIII in FIG. 46.

Figure 49:
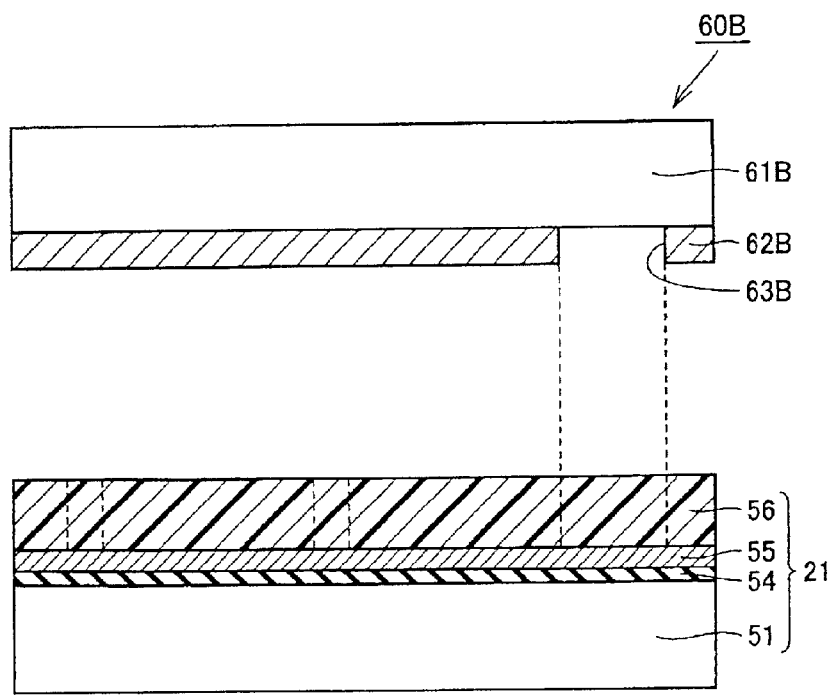

Referring to FIG. 49, the gate electrode pattern 63B of the photomask 60B shown in FIG. 47 is transferred to the photoresist material 56 by exposure with a general light exposure (=Eth/(0.3 to 0.4)). Optical conditions other than the light exposure are identical to those for the exposure shown in FIG. 48. Thereafter the photoresist material 56 is developed. FIG. 49 corresponds to a sectional view of the photomask 60B taken along the line XLIX—XLIX in FIG. 47.

Figure 50:
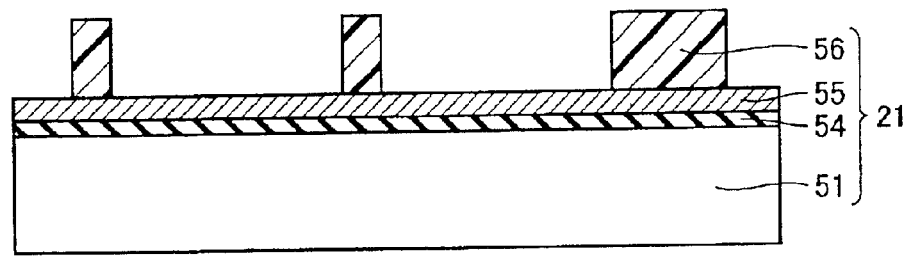

Referring to FIG. 50, only exposed areas of the gate electrode patterns 63A and 63B are left due to the aforementioned development. The patterned photoresist material 56 is employed as a mask for successively etching a conductive layer 55 and a gate insulator film 54 provided under the same.

Figure 51:
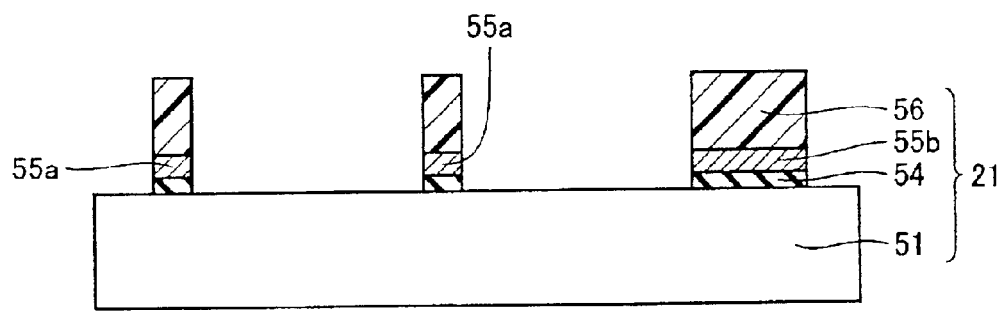
Figure 52:
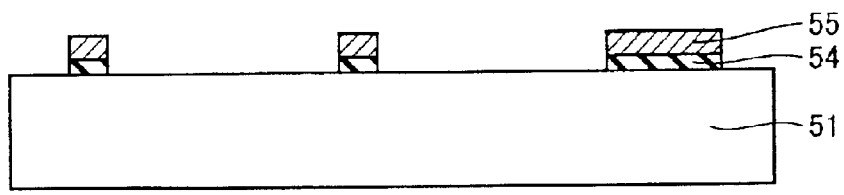

Referring to FIG. 51, the conductive layer 55 is patterned due to this etching for forming the fine gate electrodes 55a and the relatively large gate electrode 55b. Thereafter the photoresist material 56 is removed by ashing, for example, as shown in FIG. 52.

Thereafter the gate electrodes 55a and 55b etc. are employed as masks for performing ion implantation or the like, thereby forming the source/drain regions 53 on the surface of the semiconductor substrate 51 and completing the MOS transistors $T_1$ and $T_2$ shown in FIGS. 44 and 45 respectively.

Figure 53:
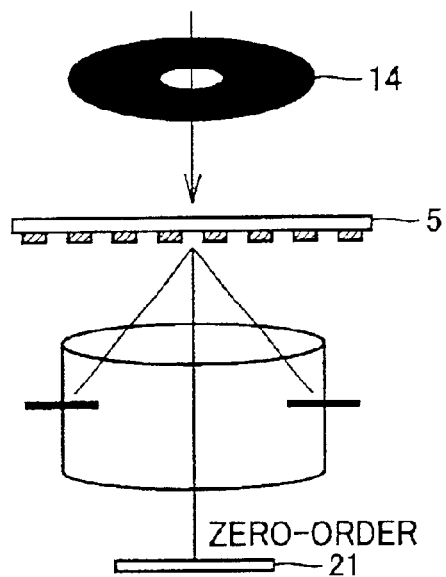
FIG. 53 is a diagram for illustrating normal illumination.

In each of the pattern forming methods according to the aforementioned first to seventh embodiments, exposure, which may be performed with general illumination, is preferably performed with deformed illumination. In general illumination, the photomask 5 is perpendicularly irradiated with exposure light as shown in FIG. 53, so that the wafer 21 is exposed with three beams including zero-order light, positive primary light and negative primary light. If the photomask 5 is refined in pattern, however, the angle of diffraction is so increased that the positive primary light and the negative primary light may not enter lenses to perform no resolution.

Figure 54:
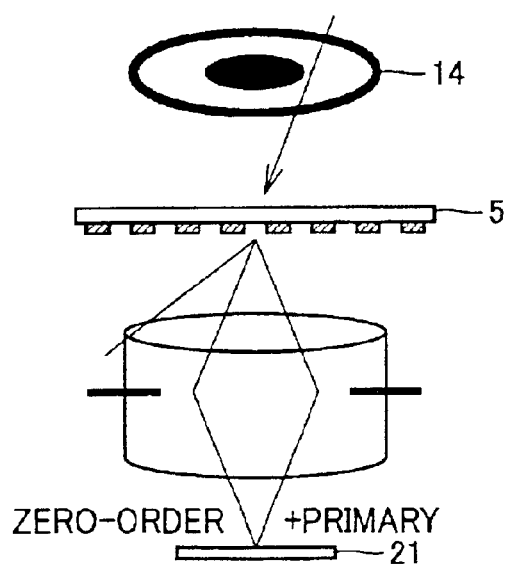
FIG. 54 is a diagram for illustrating deformed illumination.

As shown in FIG. 54, therefore, an illumination beam is obliquely incident upon the photomask 5 by deformed illumination. Thus, exposure can be performed only with two beams including zero-order light and positive or negative primary light diffracted by the photomask 5, for attaining resolution.

Figure 55:
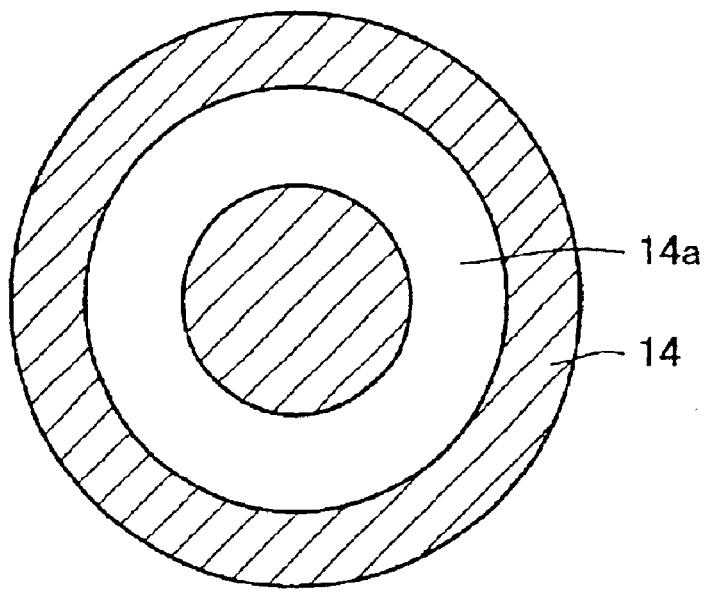
FIG. 55 is a plan view showing the structure of a zonal illumination diaphragm.
Figure 56:
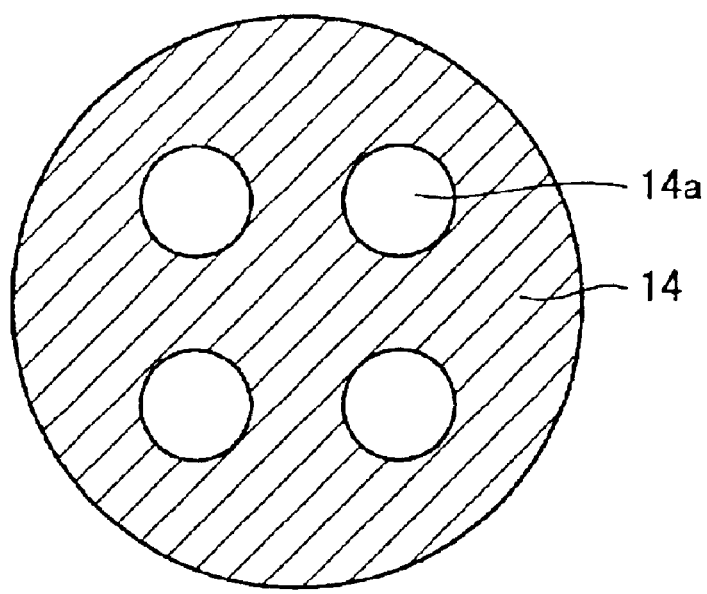
FIG. 56 is a plan view showing the structure of a quadrupole illumination diaphragm.

In this deformed illumination, a zonal illumination diaphragm having an annular transmission part 14a as shown in FIG. 55 or a quadrupole illumination diaphragm having four transmission parts 14a as shown in FIG. 56 may be employed as the diaphragm 14 shown in FIG. 3.

The aforementioned deformed illumination is preferably performed by oblique incidence illumination with such distribution of the incidence angle of illumination light illuminating the photomask 5 that light intensity within the range of the incidence angle θ satisfying $\sin(\theta) \leq (NA \times 0.2)/M$ is substantially zero assuming that θ represents the incidence angle and M represents the reduction projection magnification. Thus, isofocal characteristics can be attained by deformed illumination with a smaller line width and the same numerical aperture NA.

Figure 57:
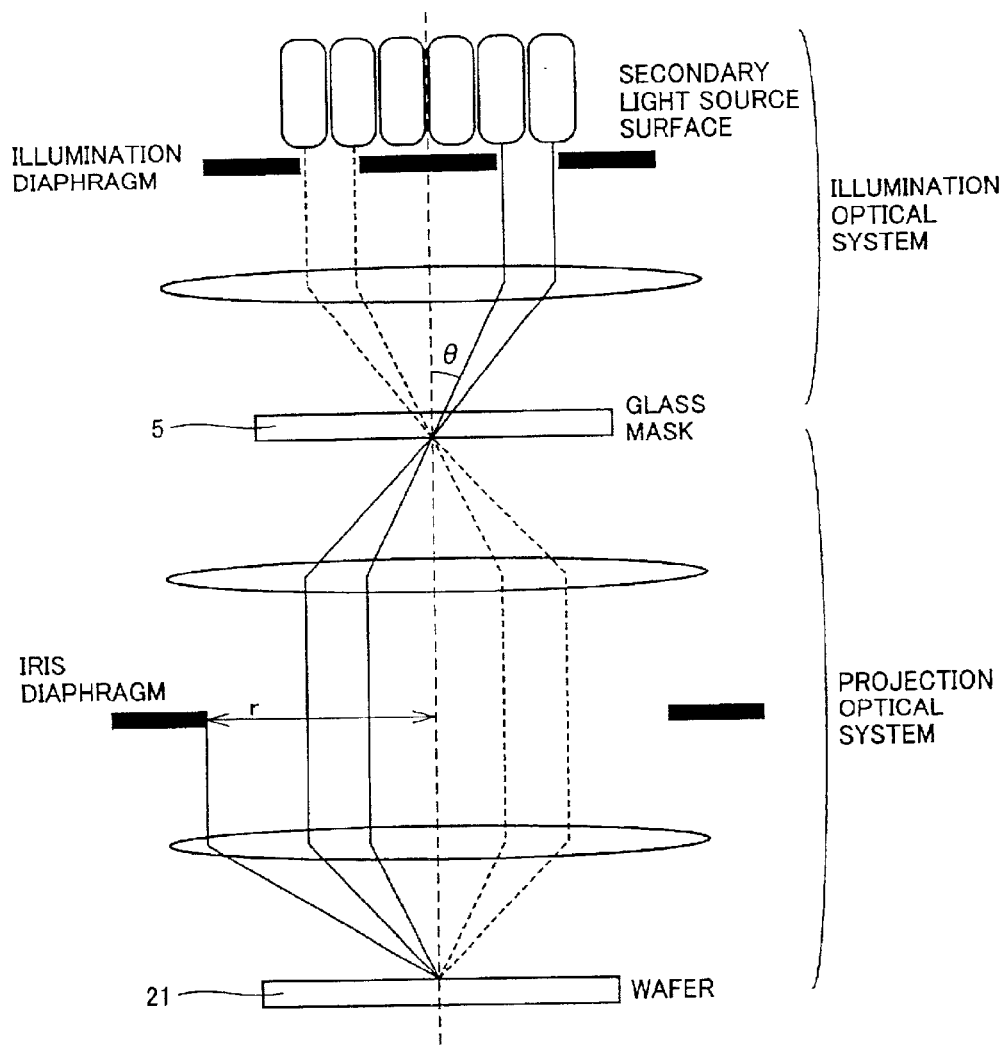
FIG. 57 is a diagram for defining the angle θ of incident light upon a photomask in deformed illumination.

As shown in FIG. 57, the radius r of an iris diaphragm is proportionate to the sine (=NA) of the maximum incidence angle of light beams in imaging.

While each of the aforementioned first to seventh embodiments has been described with reference to a method of forming patterns of a semiconductor device, the present invention is also applicable to another device (electronic device) such as a liquid crystal display, a thin-film magnetic head or the like.

The aforementioned pattern forming method preferably performs exposure with a light exposure attaining light intensity keeping the pattern dimension of the photosensitive material substantially unchanged following focal change in the step of transferring the bright line pattern to the photosensitive material by exposure.

Thus, remarkably excellent CD-focus characteristics can be attained.

The aforementioned pattern forming method preferably employs a negative photoresist material including a part photosensitized by exposure and converted from a soluble state to an insoluble state by exposure as the photosensitive material thereby forming a residual line pattern corresponding to the bright line pattern on the photoresist material.

Thus, the residual pattern can be formed with remarkably excellent CD-focus characteristics.

The aforementioned pattern forming method preferably employs a positive photoresist material including a part photosensitized by exposure and converted from an insoluble state to a soluble state as the photosensitive material thereby forming a void line pattern corresponding to the bright line pattern on the photoresist material.

Thus, the void line pattern can be formed with remarkably excellent CD-focus characteristics.

The aforementioned pattern forming method preferably forms the residual line pattern by developing the photoresist material and thereafter exposes the photoresist material to an atmosphere containing active oxygen thereby reducing the line width of the residual line pattern.

Thus, a residual line pattern having a line width not more than the minimum work dimension expected from optical image characteristics and solubility of the photoresist material can be formed.

The aforementioned pattern forming method preferably forms the void line pattern by developing the photoresist material and thereafter flows the photoresist material by heating thereby reducing the line width of the void line pattern.

Thus, a void line pattern having a line width not more than the minimum work dimension expected from optical image characteristics and solubility of the photoresist material can be formed.

The aforementioned pattern forming method preferably forms the void line pattern by developing the photoresist material and thereafter applies a chemically reactive liquid material for reacting the chemically reactive liquid material with the photoresist material and removing unreacted part of the applied liquid material thereby reducing the line width of the void line pattern.

Thus, a void line pattern having a line width not more than the minimum work dimension expected from optical image characteristics and solubility of the photoresist material can be formed.

The aforementioned pattern forming method preferably includes an exposure step employing at least two photomasks including a first photomask having a first mask pattern formed to include all line patterns having a line width L within a constant range of at least $0.20 \times (\lambda/NA) \leq L \leq 0.60 \times (\lambda/NA)$ extracted from a design drawing for a device pattern including line patterns of various line widths L and a second photomask having a second mask pattern formed to include all remaining extracted patterns.

In the above formula, λ represents the wavelength of exposure light, and NA represents the numerical aperture in a projection optical system of an exposure apparatus.

Thus, the pattern can be excellently formed by classifying line patterns with line widths L and performing exposure under conditions suitable for the respective line widths.

If the line width L of the line patterns is less than $0.20 \times (\lambda/NA)$, the light exposure for attaining the characteristics keeping the dimension unchanged following focal change must be at least 10 times a general exposure and the throughput of the exposure apparatus is reduced due to requirement for a long exposure time, leading to unavailability for industrial use. If the line width L of the line patterns is in excess of 0.60×(λ/NA), exposure energy at the pattern center with respect to that on a pattern edge is insufficient particularly in defocusing, leading to no resolution of the pattern.

The aforementioned pattern forming method preferably performs development after continuously performing exposure with the first photomask and exposure with the second photomask.

Thus, the pattern can be formed by double exposure.

The aforementioned pattern forming method preferably includes steps of developing the exposed photoresist material, selectively etching an underlayer film located under the photoresist material through the developed photoresist material serving as a mask, removing the photoresist material and applying a new photoresist material between the exposure with the first photomask and the exposure with the second photomask.

Thus, the pattern can also be formed by patterning the underlayer film (hard mask) after the first exposure and thereafter performing the second exposure.

In the aforementioned pattern forming method, the photomask is preferably such a binary mask that light transmittance of a part other than the bright line pattern can be regarded as substantially zero.

Thus, a pattern having sufficiently high dimensional accuracy can be formed by applying a general photomask employing chromium, for example, to a screen film.

In the aforementioned pattern forming method, the photomask is preferably a halftone phase-shift mask phase-inverting and transmitting light of 1% to 50% through a part other than the bright line pattern.

When a halftone phase-shift mask is employed, formation of a pattern having higher dimensional accuracy can be expected.

The aforementioned pattern forming method preferably carries out the step of transferring the bright line pattern to the photosensitive material by exposure by oblique incidence illumination with such distribution of the incidence angle of illumination light illuminating the photomask that light intensity within the range of the incidence angle θ satisfying $\sin(\theta) \leq (NA \times 0.2)/M$ is substantially zero assuming that θ represents the incidence angle and M represents the reduction projection magnification.

When such deformed illumination is employed, iso-focal characteristics can be attained with a smaller line width at the same numerical aperture NA as compared with general illumination.

In the aforementioned pattern forming method, the oblique incidence illumination is preferably zonal illumination or quadrupole illumination.

Thus, zonal illumination or quadrupole illumination can be properly selected in response to forming conditions or the like.

The method of fabricating a device according to the present invention fabricates a device having a line pattern with the aforementioned pattern forming method.

Thus, a device having a line pattern of high dimensional accuracy can be fabricated.

In the aforementioned method of fabricating a device, a semiconductor device is preferably fabricated.

Thus, a semiconductor device having a line pattern of high dimensional accuracy can be fabricated.

In the aforementioned method of fabricating a device, the line pattern is preferably a gate electrode of an insulated gate field-effect transistor.

Thus, the gate electrode of an insulated gate field-effect transistor can be formed in high dimensional accuracy.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device pattern forming method employing a photomask having bright line patterns, in which at least one line pattern has a line width L within a constant range of $0.20 \leq L/(\lambda/NA) \leq 0.6$, for transferring said bright line pattern to a photosensitive material, comprising a step of transferring said bright line pattern of said photomask to said photosensitive material by exposure with a light exposure of at least four times and not more than 10 times the light exposure (Eth) for photosensitizing said photosensitive material and inverting solubility, wherein the photomask is one of a binary mask which has its light transmittance of a part other than the bright line patterns that can be regarded as substantially zero and a halftone phase shift mask which phase inverts and transmits light of 1% to 50% through a part other than the bright line patterns.

2. The semiconductor device pattern forming method according to claim 1, performing exposure with a light exposure attaining light intensity keeping the pattern dimension of said photosensitive material substantially unchanged following focal change in said step of transferring said bright line pattern to said photosensitive material by exposure.

3. The semiconductor device pattern forming method according to claim 1, employing a negative photoresist material including a part photosensitized by exposure and converted from a soluble state to an insoluble state by exposure as said photosensitive material thereby forming a residual line pattern corresponding to said bright line pattern on said photoresist material.

4. The semiconductor device pattern forming method according to claim 3, forming said residual line pattern by developing said photoresist material and thereafter exposing said photoresist material to an atmosphere containing active oxygen thereby reducing the line width of said residual line pattern.

5. The semiconductor device pattern forming method according to claim 1, employing a positive photoresist material including a part photosensitized by exposure and convened from an insoluble state to a soluble state by exposure as said photosensitive material thereby forming a void line pattern corresponding to said bright line pattern on said photoresist material.

6. The semiconductor device pattern forming method according to claim 5, forming said void line pattern by developing said photoresist material and thereafter flowing said photoresist material by heating thereby reducing the line width of said void line pattern.

7. The semiconductor device pattern forming method according to claim 5, forming said void line pattern by developing said photoresist material and thereafter applying a chemically reactive liquid material for reacting said chemically reactive liquid material with said photoresist material and removing unreacted said applied liquid material thereby reducing the line width of said void line pattern.

8. The semiconductor device pattern forming method according to claim 1, including an exposure step employing at least two photomasks including a first photomask having a first mask pattern formed to include all line patterns having a line width L within a constant range of at least $0.20 \leq L/(\lambda/NA) \leq 0.60$ extracted from a design drawing for a device pattern including line patterns of various line widths L and a second photomask having a second mask pattern formed to include all remaining extracted patterns.

9. The semiconductor device pattern forming method according to claim 8, performing development after continuously performing exposure with said first photomask and exposure with said second photomask.

10. The semiconductor device pattern forming method according to claim 8, including steps of developing exposed said photoresist material, selectively etching an underlayer film located under said photoresist material through developed said photoresist material serving as a mask, removing said photoresist material and applying a new photoresist material between said exposure with said first photomask and said exposure with said second photomask.

11. The semiconductor device pattern forming method according to claim 1, carrying out said step of transferring said bright line pattern to said photosensitive material by exposure by oblique incidence illumination with such distribution of the incidence angle of illumination light illuminating said photomask that light intensity within the range of the incidence angle $\theta$ satisfying $\sin(\theta) \leq (NA \times 0.2)/M$ is substantially zero assuming that $\theta$ represents the incidence angle and M represents the reduction projection magnification.

12. The semiconductor device pattern forming method according to claim 11, wherein said oblique incidence illumination is zonal illumination.

13. The semiconductor device pattern forming method according to claim 11, wherein said oblique incidence illumination is quadrupole illumination.

14. A method of fabricating a device having a line pattern with the semiconductor device pattern forming method according to claim 1.

15. The method of fabricating a device according to claim 14, wherein said line pattern is a gate electrode of an insulated gate field-effect transistor.

* * * * *